United States Patent
Yamazaki et al.

(10) Patent No.: US 6,737,306 B2
(45) Date of Patent: May 18, 2004

(54) SEMICONDUCTOR DEVICE HAVING A TAPERED GATE AND METHOD OF MANUFACTURING THE SAME

(75) Inventors: Shunpei Yamazaki, Tokyo (JP); Jun Koyama, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 09/995,185

(22) Filed: Nov. 27, 2001

(65) Prior Publication Data

US 2002/0063287 A1 May 30, 2002

(30) Foreign Application Priority Data

Nov. 28, 2000 (JP) .......................... 2000-361971

(51) Int. Cl.[7] .......................... H01L 21/00; H01L 21/84
(52) U.S. Cl. .......................... 438/155; 438/30; 438/149
(58) Field of Search .......................... 438/149, 128, 438/151, 155, 152, 29–30, 129; 257/59, 72, 69, 61; 349/39, 42, 43, 47, 139

(56) References Cited

U.S. PATENT DOCUMENTS

| | | | |
|---|---|---|---|
| 4,394,182 A | * 7/1983 | Maddox, III | 257/350 |
| 5,247,190 A | 9/1993 | Friend et al. | 257/40 |
| 5,399,502 A | 3/1995 | Friend et al. | 437/1 |
| 5,616,935 A | 4/1997 | Koyama et al. | 257/69 |
| 5,643,826 A | 7/1997 | Ohtani et al. | 437/88 |
| 5,719,065 A | 2/1998 | Takemura et al. | 437/21 |
| 5,830,787 A | * 11/1998 | Kim | 438/163 |
| 5,923,962 A | 7/1999 | Ohtani et al. | 438/150 |
| 5,946,561 A | * 8/1999 | Yamazaki et al. | 438/166 |
| 6,031,290 A | 2/2000 | Miyazaki et al. | 257/764 |
| 6,124,604 A | * 9/2000 | Koyama et al. | 257/59 |
| 6,144,082 A | 11/2000 | Yamazaki et al. | 257/412 |
| 6,218,206 B1 | 4/2001 | Inoue et al. | 438/30 |
| 6,433,841 B1 | * 8/2002 | Murade et al. | 349/43 |
| 2002/0102783 A1 | 8/2002 | Fujimoto et al. | 438/200 |

FOREIGN PATENT DOCUMENTS

| | | | |
|---|---|---|---|
| EP | 1005093 A2 | * 5/2000 | ......... H01L/27/092 |
| EP | 1 045 447 | 10/2000 | |
| JP | 1-205569 | 8/1989 | |
| JP | 05-075033 | 3/1993 | |
| JP | 06-148685 | 5/1994 | |
| JP | 06-196494 | 7/1994 | |
| JP | 7-130652 | 5/1995 | |
| JP | 07-142734 | 6/1995 | |
| JP | 07-235680 | 9/1995 | |
| JP | 08-274336 | 10/1996 | |
| JP | 10-092576 | 4/1998 | |
| JP | 11-345975 | * 12/1999 | ......... H01L/21/336 |
| JP | 2000-208778 | 7/2000 | |
| JP | 2000-216396 | 8/2000 | |
| JP | 2000-216398 | 8/2000 | |
| JP | 2000-223716 | 8/2000 | |
| JP | 2000-228527 | 8/2000 | |

(List continued on next page.)

OTHER PUBLICATIONS

English abstract re Japanese Patent Application No. 1–205569, published Aug. 17, 1989.

1) U.S. patent application Publication No. US–2001–0030322–A1 (pending) to Yamazaki et al.

U.S. patent application No. 09/433,705 (pending) including specification, claims, abstract and drawings.

(List continued on next page.)

*Primary Examiner*—Shouxiang Hu
(74) *Attorney, Agent, or Firm*—Cook, Alex, McFarron, Manzo, Cummings & Mehler, Ltd.

(57) ABSTRACT

In a semiconductor device and a method of manufacturing the semiconductor device, the source wires 126 of a pixel portion 205 are formed of material having low resistance (representatively, aluminum, silver, copper). The source wires of a driving circuit are formed in the same process as the gate wires 162 of the pixel portion and a pixel electrode 163.

32 Claims, 13 Drawing Sheets

FOREIGN PATENT DOCUMENTS

| JP | 2000-236097 | 8/2000 |
|---|---|---|
| JP | 2000-243975 | 9/2000 |
| JP | 2001-094113 | 4/2001 |
| JP | 2001-094116 | 4/2001 |
| JP | 2001-111060 | 4/2001 |
| JP | 2001-210832 | 8/2001 |
| TW | 406311 | 9/2000 |
| WO | WO 90/13148 | 11/1990 |

OTHER PUBLICATIONS

U.S. patent application No. 09/436,984 (pending) including specification, claims, abstract and drawings.
U.S. patent application No. 09/447,574 (pending) including specification, claims, abstract and drawings.
U.S. patent application No. 09/464,200 (pending) including specification, claims, abstract and drawings.
U.S. patent application No. 09/471,359 (pending) including specification, claims, abstract and drawings.
U.S. patent application No. 09/714,891 (pending) including specification, claims, abstract and drawings.
U.S. patent application No. 09/432,662 (pending) including specification, claims, abstract and drawings.
U.S. patent application No. 09/435,154 (pending) including specification, claims, abstract and drawings.
U.S. patent application No. 09/441,025 (pending) including specification, claims, abstract and drawings.
U.S. patent application No. 09/454,146 (pending) including specification, claims, abstract and drawings.
U.S. patent application No. 09/618,930 (pending) including specification, claims, abstract and drawings.
U.S. patent application No. 09/619,732 (pending) including specification, claims, abstract and drawings.
English abstract re Japanese Patent Application No. JP 05–075033.
Full English translation & abstract of Japanese Patent Application No. JP 06–148685.
Full English translation & abstract of Japanese Patent Application No. JP 06–196494.
English abstract re Japanese Patent Application No. JP 07–142734.
Full English translation & abstract of Japanese Patent Application No. JP 07–235680.
Full English translation & abstract of Japanese Patent Application No. JP 08–274336.
English abstract re Japanese Patent Application No. JP 2000–208778.
English abstract re Japanese Patent Application No. JP 2000–216396.
English abstract re Japanese Patent Application No. JP 2000–216398.
English abstract re Japanese Patent Application No. JP 2000–223716.
English abstract re Japanese Patent Application No. JP 2000–228527.
English abstract re Japanese Patent Application No. JP 2000–236097.
English abstract re Japanese Patent Application No. JP 2000–243975.
English abstract re Japanese Patent Application No. JP 2001–094113.
English abstract re Japanese Patent Application No. JP 2001–094116.
English abstract re Japanese Patent Application No. JP 2001–111060.
English abstract re Japanese Patent Application No. JP 2001–210832.
Schenk, H. et al, "Polymers for Light Emitting Diodes," Eurodisplay '99, Proceedings of the 19th International Display Research Conference, Sep. 6–9, 1999, Berlin, Germany, pp. 33–37, 1999.
English abstract re Japanese patent application No. 7–130652, published May 19, 1995.
English abstract re Japanese patent application No. 10–092576, published Apr. 10, 1998.
U.S. patent application No. 09/528,113 (pending) to Yamazaki et al, including specification, claims, abstract, drawings and PTO filing receipt.
U.S. patent application No. 09/533,040 (pending) to Yamazaki, including specification, claims, abstract, drawings, PTO filing receipt and allowed claims.
U.S. patent application No. 09/559,185 (pending) to Yamazaki, including specification, claims, abstract, drawings, PTO filing receipt and pending claims as of Apr. 9, 2002.
Austrian Patent Office search report re Singapore application no. 200107179–4, mailed Aug. 13, 2003.

* cited by examiner

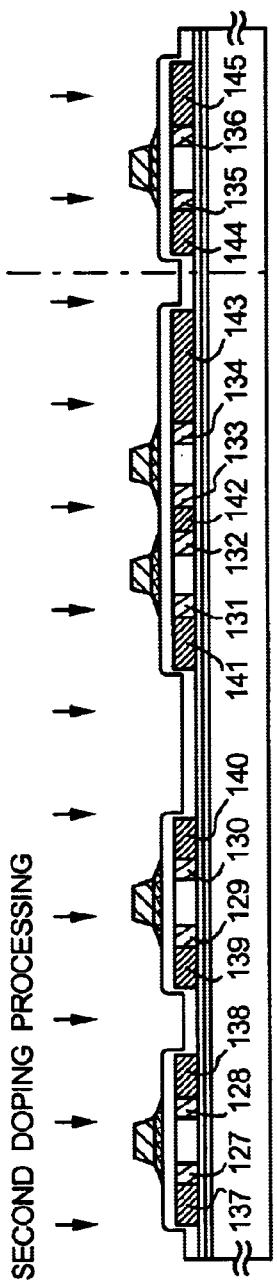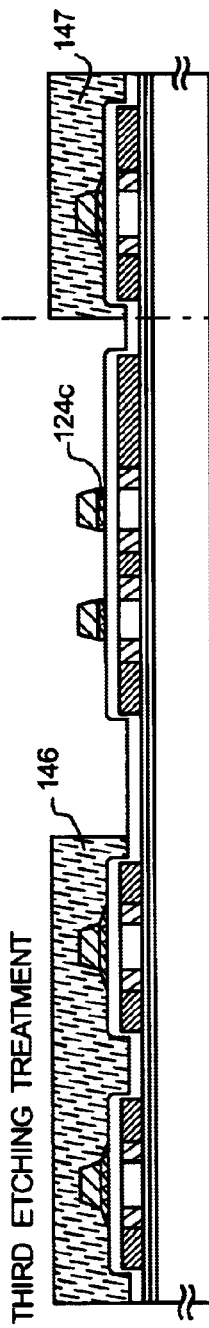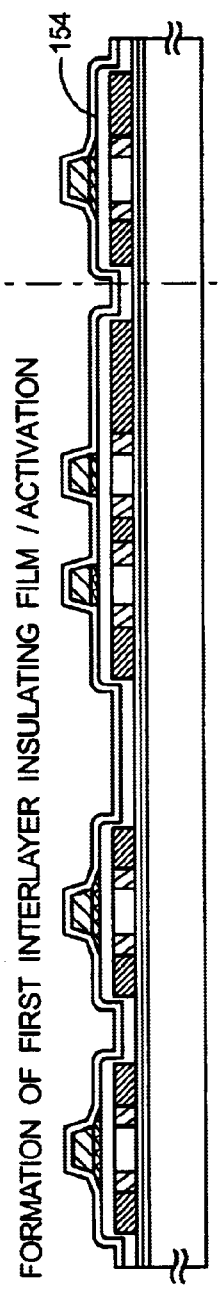

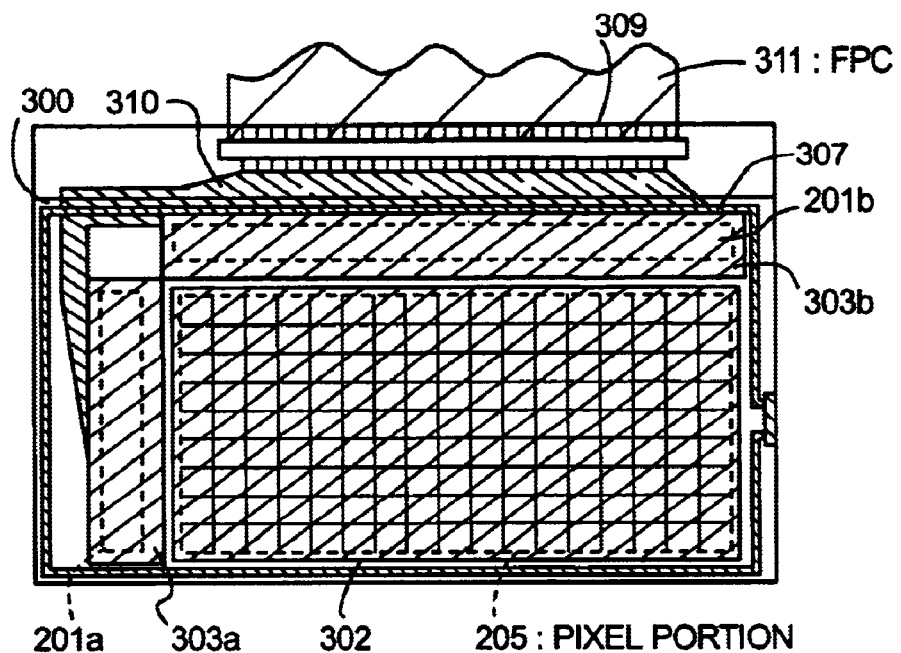
FIG. 7
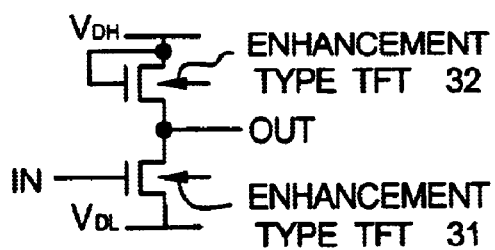
FIG. 8A   EEMOS CIRCUIT
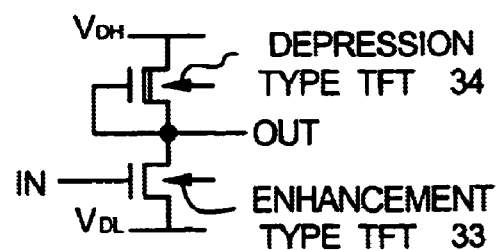
FIG. 8B   EDMOS CIRCUIT

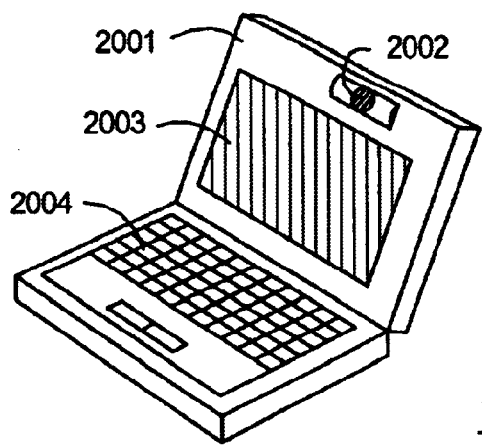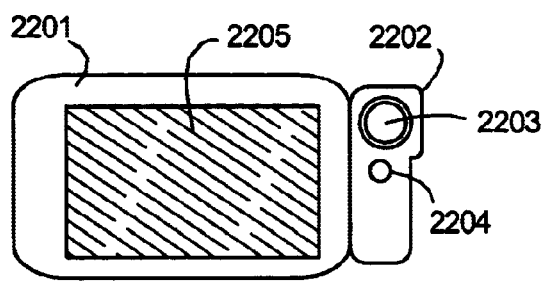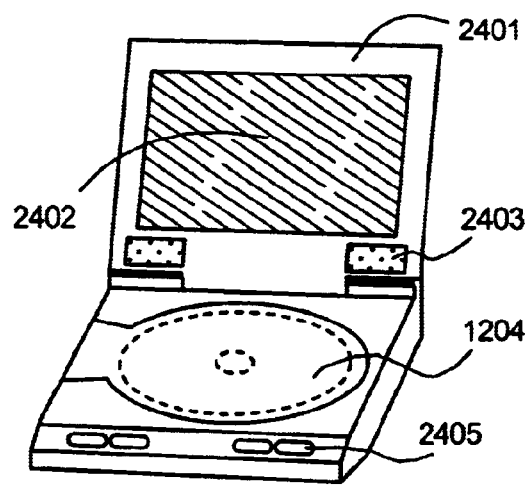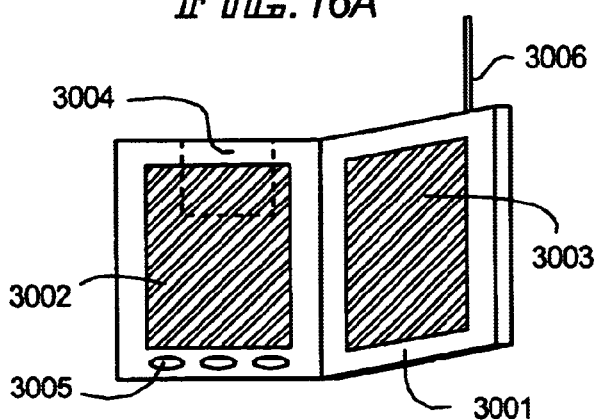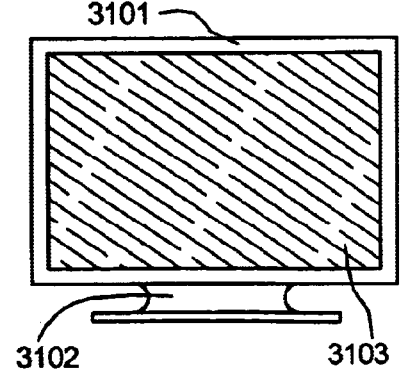

SEMICONDUCTOR DEVICE HAVING A TAPERED GATE AND METHOD OF MANUFACTURING THE SAME

BACKGROUND OF THE INVENTION

1. Field of the Invention

The present invention relates to a semiconductor device having a circuit constructed by thin-film transistors (hereinafter referred to as "TFT"), and a method of manufacturing the semiconductor device. For example, the present invention relates to an electrooptical device represented by a liquid crystal display panel and electronic equipment in which such an electrooptical device is mounted as a part.

In this specification, the semiconductor device means a general device that functions by using semiconductor characteristics, and an electrooptical device, a semiconductor circuit and electronic equipment are defined as a semiconductor device.

2. Description of the Related Art

Recently, much attention has been paid to a technique of forming a thin film transistor (TFT) by using a semiconductor thin film (having a thickness of about several to several hundreds nm) formed on a substrate having an insulating surface. The thin film transistor has been widely applied to electrical devices such as IC, an electrooptical device, etc., and particularly developments to apply the thin film transistor to a switching element of an image display device have been rapidly required.

A liquid crystal display device is well known as an image display device. The active matrix type liquid crystal display device has been more frequently used than the passive type liquid crystal display device because higher-definition images can be provided by the active matrix type liquid crystal display device. In the active matrix type liquid crystal display device, a display pattern is formed on a screen by driving pixel electrodes arranged in a matrix form. More specifically, a voltage is applied across a selected pixel electrode and a counter electrode confronting the selected pixel electrode to optically modulate a liquid crystal layer disposed between the pixel electrode and the counter electrode, so that the optical modulation is recognized as a display pattern by a viewer.

Such active matrix type liquid crystal devices have been widely used in more diverse fields, and not only the large-area design of a screen size, but also high definition, high numerical aperture and high reliability design has been increasingly required. At the same time the enhancement of the productivity and the reduction in manufacturing cost have been also increasingly required.

When TFT is formed by using aluminum as a gate wiring material for TFT, malfunction of TFT and degradation in TFT characteristics are caused by formation of projections such as hillocks, whiskers, etc. due to a heat treatment and diffusion of aluminum atoms in a channel-forming region. On the other hand, when metal material having high resistance to the heat treatment, typically a metal element having a high melting point is used in order to avoid the above problem, there occurs another problem that the resistance of wires would increase if the screen size is increased, resulting in increase of power consumption, etc.

SUMMARY OF THE INVENTION

Therefore, an object of the present invention is to provide the structure of a semiconductor device that can reduce power consumption even when the screen size is increased, and method of manufacturing the semiconductor device.

According to the present invention, in order to attain the above object, source wires and gate wires are formed by low-resistance material (typically, aluminum, silver, copper or alloy thereof). The gate electrode is provided on a layer different from that of the gate wires. Further, all the NMOS circuits of a driving circuit are formed by n-channel type TFTs, and TFTs of a pixel portion are also formed of n-channel type TFTs.

In order to form an NMOS circuit by combining n-channel type TFTs, there are two cases, one case where the NMOS circuit is formed by combining enhancement type TFTs as shown in FIG. 8A (hereinafter referred to as "EEMOS circuit"), and the other case where the NMOS circuit is formed by combining an enhancement type and a depression type (hereinafter referred to as "EDMOS circuit") as shown in FIG. 8B.

In order to form the enhancement type and the depression type separately from each other, an element belonging to the fifteenth group of the periodic table (preferably phosphorus) or an element belonging to the thirteenth group of the periodic table (preferably boron) may be suitably doped into a semiconductor serving as a channel-forming region.

The source wires of the pixel portion are formed in a step different from that of the source wires of the driving circuit portion.

According to an aspect of the present invention, there is provided a semiconductor device equipped with TFT containing a semiconductor layer formed on an insulating surface, an insulating film formed on the semiconductor layer, and a gate electrode formed on the insulating film, characterized by including: a pixel portion having a first n-channel type TFT and a driving circuit having a circuit comprising a second n-channel type TFT and a third n-channel type TFT, wherein the gate electrode of each of the first n-channel type TFT, the second n-channel type TFT and the third n-channel type TFT has a laminate structure comprising a first conductive layer having a first width as a lower layer and a second conductive layer having a second width smaller than the first width as an upper layer.

According to another aspect of the present invention, there is provided a semiconductor device equipped with TFT containing a semiconductor layer formed on an insulating surface, an insulating film formed on the semiconductor layer, and a gate electrode formed on the insulating film, characterized by including: a pixel portion having a first n-channel type TFT, and a driving circuit having a second n-channel type TFT and a third n-channel type TFT, wherein the gate electrode of the first n-channel type TFT has a laminate structure comprising a second conductive layer and a first conductive layer having the same width as the second conductive layer, and the gate electrode of each of the second and third n-channel type TFTs has a laminate structure comprising a first conductive layer having a first width as a lower layer and a second conductive layer having a second width smaller than the first width as an upper layer.

In each of the above semiconductor devices, an EEMOS circuit or an EDMOS circuit is formed by the second n-channel type TFT and the third n-channel type TFT.

In each of the above semiconductor devices, each of the n-channel type TFTs of the driving circuit has a gate electrode having a tapered portion, a channel-forming region overlapped with the gate electrode and an impurity region partially-overlapped with the gate electrode.

In each of the above semiconductor devices, the concentration of impurities in the impurity region of the n-channel type TFT contains an area having a concentration gradient in the range from at least $1\times10^{17}$ to $1\times10^{18}/cm^3$, and the concentration of the impurities is increased as the distance from the channel-forming region is increased.

In each of the above semiconductor devices, the source wires of the n-channel type TFTs of the driving circuit and the source wires of the n-channel type TFTs of the pixel portion are formed of different materials.

In each of the above semiconductor devices, the source wires of the pixel portion are formed of materials that mainly contain Al, Cu or Ag.

In each of the above semiconductor devices, the source wires of the pixel portion are formed by a sputtering method, a print method, a plating method or any combination thereof.

Each of the above semiconductor devices is a reflection type or transmission type liquid crystal module.

According to another aspect of the present invention, there is provided a method of manufacturing a semiconductor device having a driving circuit and a pixel portion on an insulating surface, characterized by comprising: a step of forming a semiconductor layer on an insulating surface; a step of forming a first insulating film on the semiconductor layer; a step of forming a first gate electrode on the first insulating film; a step of doping impurity elements providing n-type into the semiconductor layer by using the first gate electrode as a mask to form an n-type first impurity region; a step of etching the first gate electrode to form a tapered portion; a step of doping impurity elements providing n-type into a semiconductor layer while passing through the taper portion of the first gate electrode to thereby form an n-type second impurity region; a step of forming a second insulating film so as to cover the first gate electrode; a step of forming source wires of the pixel portion on the second insulating film; a step of forming a third insulating film so as to cover the source wires of the pixel portion; and a step of forming a source wire of the driving circuit and a gate wire on the third insulating film.

According to another aspect of the present invention, there is provided a method of manufacturing a semiconductor device having an n-channel type TFT having a first semiconductor layer and a first gate electrode on an insulating surface, and an n-channel type TFT having a second semiconductor layer and a second gate electrode, characterized by comprising: a step of forming a first semiconductor layer and a second semiconductor layer on an insulating surface; a step of forming a first insulating film on the first semiconductor layer and the second semiconductor layer; a step of forming first gate electrodes on the first insulating film; a step of doping impurity elements providing n-type into the first semiconductor layer and the second semiconductor layer by using the first gate electrodes as masks to form n-type first impurity regions; a step of etching the first gate electrodes to form tapered portions; a step of doping impurity elements providing n-type into the first semiconductor layer and the second semiconductor layer while passing through the tapered portions of the first gate electrodes to form n-type second impurity regions; a step of selectively removing only the tapered portion of the first gate electrode above the second semiconductor layer to form a second gate electrode; a step of forming a second insulating film so as to cover the first gate electrode and the second gate electrode; a step of forming source wires of the pixel portion on the second insulating film; a step of forming a third insulating film so as to cover the source wires of the pixel portion; and a step of forming source wires of the driving circuits and gate wires on the third insulating film.

In the above manufacturing method, the n-channel type TFT having the first gate electrode is a TFT of the driving circuit.

In the above manufacturing method, the n-channel type TFT having the second gate electrode is a TFT of the pixel portion.

In the above manufacturing method, a pixel electrode is formed at the same time as the source wires of the driving circuit.

In the above manufacturing method, the step of forming the source wires of the pixel portion is a sputtering method, a print method, a plating method or a combination thereof.

In the above manufacturing method, the first gate electrode has a laminate structure comprising a first conductive layer having a first width as a lower layer and a second conductive layer having a second width smaller than the first width as an upper layer. The sectional shape of an area of the first conductive layer that is not overlapped with the second conductive layer is a tapered shape.

BRIEF DESCRIPTION OF THE DRAWINGS

FIGS. 2A to 2C are diagrams showing another manufacturing process of AM-LCD;

FIG. 7 is a diagram showing the outlook of a liquid crystal module;

FIGS. 8A and 8B are diagrams showing the construction of an NMOS circuit;

FIGS. 15A to 15C are diagrams showing electronic equipment; and

FIGS. 16A and 16B are diagrams showing electronic equipment.

DETAILED DESCRIPTION OF THE PREFERRED EMBODIMENTS

Figure 1A:
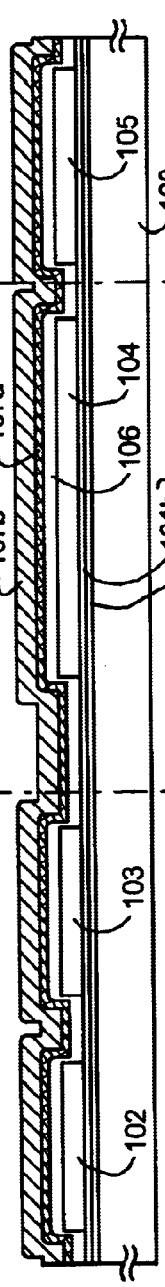
FIGS. 1A to 1D are diagrams showing a manufacturing process of AM-LCD.
Figure 1B:
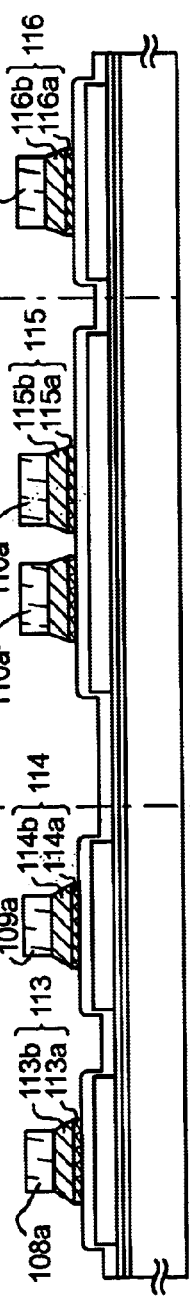

The present invention will be described hereunder with reference to the accompanying drawings.

First, after a base insulating film is formed on a substrate, a semiconductor layer having a desired shape is formed by using a first photolithography process.

Subsequently, an insulating film (containing a gate insulating film) is formed so as to cover the semiconductor layer. A first conductive film and a second conductive film are formed and laminated on the insulating film. The laminate film thus formed is subjected to a first etching treatment by using a second photolithography process to form a gate electrode comprising the first conductive layer and the second conductive layer. In the present invention, after the gate electrode is previously formed, gate wires are formed on an inter-layer insulating film.

Subsequently, impurity elements providing n-type (phosphorus or the like) are doped into the semiconductor under the state that a resist mask formed in the second photolithography process is left unmodified, thereby forming an n-type impurity region (high concentration) in self-alignment.

Subsequently, the etching condition is changed and a second etching treatment is carried out under the state that the resist mask formed in the second photolithography process is left unmodified, and a first conductive layer (first width) having a tapered portion and a second conductive layer (second width) are formed. The first width is set to be larger than the second width, and the electrode comprising the first conductive layer and the second conductive layer serves as a gate electrode (first gate electrode) of an n-channel type TFT.

Subsequently, after the resist mask is removed, impurity elements providing n-type are passed through the tapered portion of the first conductive layer and doped into the semiconductor layer by using the second conductive layer as a mask. Here, a channel-forming region is formed below the second conductive layer, and an impurity region (low concentration) is formed below the first conductive layer so that the impurity concentration gradually increases as the distance from the channel-forming region is longer.

Thereafter, when the tapered portion is selectively removed to reduce off-current, the number of mask sheets is increased by one to form a resist mask covering a portion other than the pixel portion, and then the etching treatment is carried out to remove only the tapered portion of the gate electrode of the pixel portion.

Subsequently, after an insulating film for protecting the gate electrode is formed, the impurity elements doped in each semiconductor layer are activated, and then source wires formed of metal material having low resistance (typically, material containing aluminum, silver or copper as a main component) are formed on the insulating film at only the pixel portion by a third photolithography process. As described above, according to the present invention, the source wires of the pixel portion are formed of the metal material having low resistance. Therefore, even when the area of the pixel portion is increased, the pixel portion can be sufficiently driven. Further, since the number of mask sheets is reduced, the source wires may be formed by the print method.

Subsequently, an interlayer insulating film is formed, and then contact holes are formed by a fourth photolithography process. In this case, a contact hole extending to the impurity region, a contact hole extending to the gate electrode and a contact hole extending to the source wire are formed.

Subsequently, a conductive film formed of metal material having low resistance is formed, and electrodes for connecting each of the gate wire and the source wire to the impurity region and a pixel electrode are formed by a fifth photolithography process. In the present invention, each gate wire is electrically connected to the first gate electrode or the second gate electrode through the contact hole provided in the interlayer insulating film. Each source wire is electrically connected to the impurity region (source region) through the contact hole provided in the interlayer insulating film. The pixel electrode is electrically connected to the impurity region (drain region) through the contact hole provided in the interlayer insulating film. A metal material having high reflectivity is preferably used as the material of the conductive layer because it constitutes the pixel electrode, and materials containing aluminum or silver as a main component are typically used.

As described above, according to the present invention, the gate wires are formed of the metal material having low resistance, and thus even when the area of the pixel portion is increased, the pixel portion can be sufficiently driven.

As described above, a device substrate having a pixel portion having a pixel TFT (n-channel TFT) and a driving circuit having an EEMOS circuit (n-channel type TFT) as shown in FIG. 8A can be formed by carrying out the photolithography process totally at five times, that is, by using five mask sheets. In this case, the foregoing process is directed to formation of a reflection type display device, however, the method of the present invention may be applied to a transmission type display device. When a transmission type display device is manufactured, a device substrate can be formed by using six mask sheets because it is necessary to subject a transparent conductive film to a patterning treatment.

Further, in a case where an EDMOS circuit as shown in FIG. 8B is formed by combining an enhancement type and a depression type, before the conductive film is formed, the mask is beforehand formed and an element belonging to the fifteenth group of the periodic table (preferably, phosphorus) or an element belonging to the thirteenth group of the periodic table (preferably, boron) may be selectively doped into the semiconductor serving as the channel-forming region. In this case, the device substrate can be formed by using six mask sheets.

When the third photolithography is not used and the source wires of the pixel portion are formed by the print method, the device substrate can be formed by using four mask sheets.

The present invention having the above construction will be described in more detail on the basis of the following preferred embodiments.

Embodiments

First Embodiment

In this embodiment, a method of simultaneously manufacturing a pixel portion (n-channel TFT) and TFTs (EEMOS circuit formed by the n-channel TFT) comprising a NMOS circuit of a driving circuit, which is provided on the periphery of the pixel portion, on the same substrate will be described with reference to FIGS. 1 to 5.

In this embodiment, a substrate 100 is used, which is made of barium borosilicate glass such as #7059 glass and #1737 glass produced by Corning Corp. or aluminoborosilicate glass. As the substrate 100, any substrate can be used. A quartz substrate, a silicon substrate, a metal substrate, or stainless substrate forming an insulating film on the surface may be used. A plastic substrate having heat resistance enduring a treatment temperature of this embodiment also may be used.

Then, an underlying film 101 composed of an insulating film such as a silicon oxide film, a silicon nitride film, or a silicon oxide nitride film is formed on the substrate 100. In this embodiment, a two-layered structure is used as the underlying film 101. However, a single insulating film or a lamination of two or more insulating films using the above insulating film may also be used. As a first layer of the underlying film 101, a silicon oxide nitride film 101a is formed to a thickness of 10 to 200 nm (preferably, 50 to 100 nm) by plasma CVD, using $SiH_4$, $NH_3$, and $N_2O$ as reactive gas. In this embodiment, a silicon oxide nitride film 101a (a composition ratio: Si=32%, O=27%, N=24%, and H=17%) having a thickness of 50 nm is formed. Then, as a second layer of underlying film 101, a silicon oxide nitride film 101b is formed to a thickness of 50 to 200 nm (preferably, 100 to 150 nm) by plasma CVD, using $SiH_4$ and $N_2O$ as reactive gas. In this embodiment, a silicon oxide nitride film (a composition ratio: Si=32%, O=59%, N=7%, and H=2%) having a thickness of 100 nm is formed.

Then, semiconductor layers 102 to 105 are formed on the underlying film. The semiconductor layers 102 to 105 are formed by forming a semiconductor film having an amorphous structure by a known method (sputtering, LPCVD, plasma CVD, or the like), conducting a known crystallization processing (laser crystallization, thermal crystallization, or thermal crystallization using a catalyst such as nickel) to obtain a crystalline semiconductor film, and patterning the film into a desired shape. The semiconductor layers 102 to 105 are formed to a thickness of 25 to 80 nm (preferably, 30 to 60 nm). There is no particular limit regarding the material for the crystalline semiconductor film. However, it is preferable to form the crystalline semiconductor film of silicon or a silicon germanium alloy. In this embodiment, an amorphous silicon film of 55 nm is formed by plasma CVD, and thereafter, a solution containing nickel is held on the amorphous silicon film. The amorphous silicon film is dehydrogenated (at 500° C., for one hour), and then subjected to thermal crystallization (at 550° C., for 4 hours) Furthermore, laser annealing is conducted for the purpose of improving crystallization, whereby a crystalline silicon film is formed. The crystalline silicon film is subjected to patterning by photolithography to form the semiconductor layers 102 to 105.

Furthermore, after the semiconductor layers 102 to 105 are formed, doping of a trace amount of impurity elements (boron or phosphorus) may be appropriately conducted so as to manufacture separately enhancement type and depression type.

Furthermore, in the case of manufacturing a crystalline semiconductor film by laser crystallization, a pulse-oscillation type or continuous light emission type excimer laser, a YAG laser, and a $YVO_4$ laser can be used. When using these lasers, laser light emitted from a laser oscillator may be condensed into a line shape by an optical system and allowed to radiate to a semiconductor film. Crystallization conditions are appropriately selected by the operator. However, when using a pulse oscillation excimer laser, a pulse oscillation frequency is set to be 30 Hz, and a laser energy density is set to be 100 to 400 $mJ/cm^2$ (typically 200 to 300 $mJ/cm^2$). In the case of using a pulse oscillation YAG laser, the second harmonic thereof may be used, a pulse oscillation frequency may be set to be 1 to 10 kHz, and a laser energy density may be set to be 300 to 600 $mJ/cm^2$ (typically, 350 to 500 $mJ/cm^2$). Laser light condensed in a line shape with a width of 100 to 1000 $\mu m$ (e.g., 400 $\mu m$) may be radiated over the entire surface of a substrate, and a line-shaped laser light overlap ratio at this time may be set to be 80 to 98%.

Figure 14:
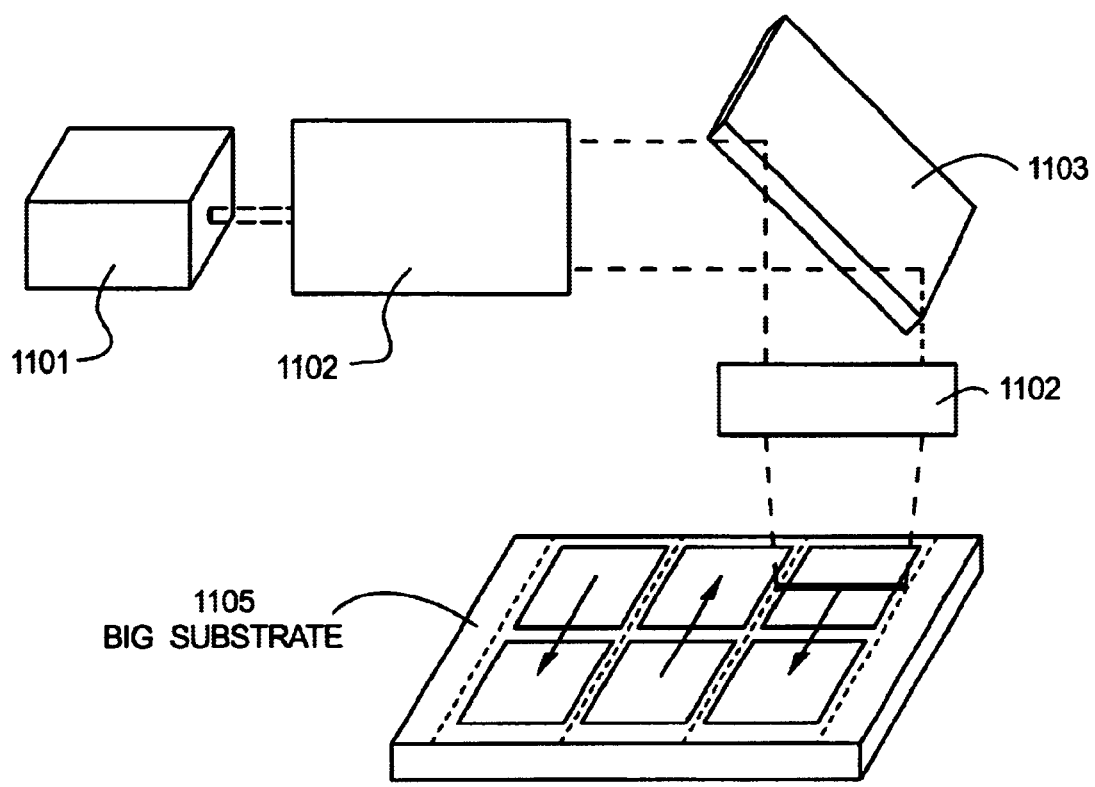
FIG. 14 is a schematic diagram showing a laser irradiation operation.

In addition, the state of laser radiation is shown briefly in FIG. 14. The laser light emitted from the laser light source 1101 is radiated to a big substrate by the optical system 1102 and the mirror 1103. The arrow on the big substrate shows a scanning direction of the laser light. FIG. 14 shows executing a multiple pattern to form six substrates sized 12.1 inches from the big substrate 1105 sized 650×550 nm.

Then, a gate insulating film 106 is formed so as to cover the semiconductor layers 102 to 105. The gate insulating film 106 is formed of an insulating film containing silicon so as to have a thickness of 40 to 150 nm by plasma CVD or sputtering. In this embodiment, a silicon oxide nitride film (a composition ratio: Si=32%, O=59%, N=7%, and H=2%) is formed to a thickness of 115 nm by plasma CVD. Needless to say, the gate insulating film 106 is not limited to a silicon oxide nitride film, and may have a single layer or layered structure of insulating films containing silicon.

Then, as shown in FIG. 1A, a first conductive film 107a (thickness: 20 to 100 nm) and a second conductive film 107b (thickness: 100 to 400 nm) are laminated on the gate insulating film 106. In this embodiment, the first conductive film 107a made of a TaN film having a thickness of 30 nm and the second conductive film 107b made of a W film having a thickness of 370 nm are laminated thereon. The TaN film is formed by sputtering using Ta as a target in an atmosphere containing nitrogen. The W film is formed by sputtering using W as a target. The W film can also be formed by thermal CVD using tungsten hexafluoride ($WF_6$). In any case, it is required to lower a resistance in order to use the W film as a gate electrode, and it is desirable that a resistance ratio of the W film is 20 $\mu\Omega cm$ or less. The resistance ratio of the W film can be lowered by enlarging crystal grains thereof. However, in the case where there are a number of impurity elements such as oxygen in the W film, crystallization is inhibited, and the resistance of the W film is increased. Therefore, in this embodiment, the W film is formed by sputtering using high-purity W (purity: 99.9999% or 99.99%) as a target so that no impurity may be allowed to enter in the W film from a vapor phase during the film formation, whereby a resistance ratio of 9 to 20 $\mu\Omega cm$ can be achieved.

In this embodiment, the first conductive film 107a is made of TaN, and the second conductive film 107b is made of W. However, the present invention is not limited thereto. Both the films may be formed of an element selected from Ta, W, Ti, Mo, Al, Cu, Cr, and Nd, or an alloy material containing the element as its main component or a compound material. A semiconductor film such as a polycrystalline silicon film doped with an impurity element such as phosphorus may also be used. Furthermore, the following combination may be used: the first conductive film made of a tantalum (Ta) film and the second conductive film made of a W film; the first conductive film made of a titanium nitride (TiN) film and the second conductive film made of a W film; the first conductive film made of a tantalum nitride (TaN) film and the second conductive film made of an Al film; the first conductive film made of tantalum nitride (TaN) film and the second conductive film made of a Cu film.

Then, masks 108a to 111a made of a resist are formed by photolithography, and first etching processing for forming electrodes and wiring is conducted. The first etching processing is conducted as first and second etching conditions. In this embodiment, under the first etching condition, etching is conducted by an inductively coupled plasma (ICP) etching method, in which plasma is generated by using $CF_4$, $Cl_2$, and $O_2$ as etching gas (a flow rate: 25/25/10 (sccm)) with an RF power (13.56 MHZ) of 500 W supplied to a coil-shaped electrode at a pressure of 1 Pa. As the etching gas, chlorine type gas such as $Cl_2$, $BCl_3$, $SiCl_4$, and $CCl_4$ or fluorine gas such as $CF_4$, $SF_6$, and $NF_3$, or $O_2$ can be appropriately used. Herein, a dry etching apparatus (Model E645-ICP) using ICP produced by Matsushita electric Industrial Co., Ltd. is used. An RF power (13.56 MHZ) of 150 W is also applied to the substrate side (a sample stage), whereby a substantially negative self-bias voltage is applied thereto. Under the first etching condition, the W film is etched and end portions of the first conductive layer are tapered. Under the first etching condition, an etching rate with respect to W is 200.39 nm/min., an etching rate with respect to TaN is 80.32 nm/min., and a selection ratio of W with respect to TaN is about 2.5. Furthermore, under the first etching condition, a taper angle of W becomes about 26°.

Thereafter, without removing the masks 108a to 111a made of resist, etching is conducted for about 30 seconds under the second etching condition, in which plasma is generated by using $CF_4$ and $Cl_2$ as etching gas (flow rate ratio: 30/30 (sccm)) with an RF power (13.56 MHZ) of 500 W supplied to a coil-shaped electrode at a pressure of 1 Pa. An RF power (13.56 MHZ) of 20 W is also applied to the substrate side (a sample stage), whereby a substantially negative self-bias voltage is applied thereto. Under the second etching condition using a mixture of $CF_4$ and $Cl_2$ as etching gas, the W film and the TaN film are etched to the same degree. Under the second etching condition, an etching rate with respect to W is 58.97 nm/min., and an etching rate with respect to TaN is 66.43 nm/min. In order to conduct etching without leaving any residual on the gate insulating film, an etching time may be increased by about 10 to 20%.

According to the above first etching processing, by appropriately prescribing the shape of a resist mask, the end portions of the first conductive layer and the second conductive layer are tapered due to the effect of a bias voltage applied to the substrate side. The angle of the taper portion may be 15 to 45°.

Thus, conductive layers 113 to 116 (first conductive layers 113a to 116a and second conductive layers 113b to 116b) of a first shape composed of first conductive layers and second conductive layers are formed by the first etching processing. (FIG. 1B) The width of the first conductive layer in the channel length direction corresponds to the first width shown in the above embodiment mode. Although not shown, regions of the insulating film 106 to be a gate insulating film, not covered with the conductive layers 113 to 116 of a first shape, are etched by about 10 to 20 nm to be thin.

Figure 1C:
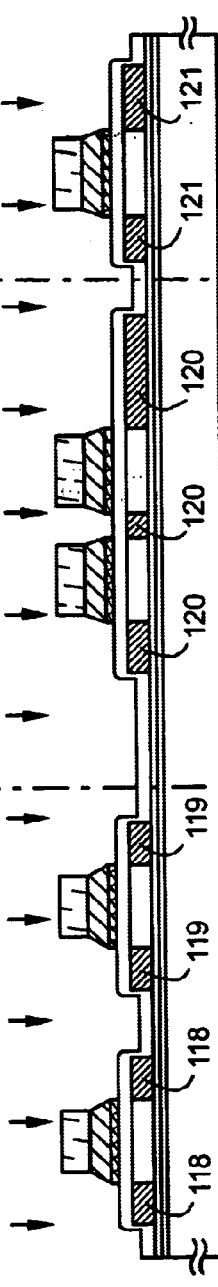
Figure 1D:
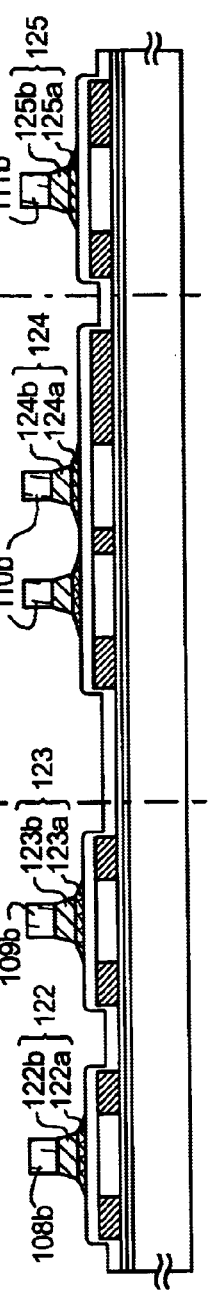

Without removing the resist masks, first doping processing is conducted, whereby an impurity element providing an n-type is added to the semiconductor layers (FIG. 1C). The doping processing may be conducted by ion doping or ion implantation. Ion doping is conducted under the conditions of a dose amount of $1 \times 10^{13}$ to $5 \times 10^{15}/cm^2$ and an acceleration voltage of 60 to 100 keV. In this embodiment, doping is conducted at a dose amount of $1.5 \times 10^{15}/cm^2$ and an acceleration voltage of 80 keV. As the impurity element providing an n-type, an element belonging to Group 15, typically, phosphorus (P) or arsenic (As) is used. Herein, phosphorus (P) is used. In this case, the conductive layers 113 to 116 function as masks with respect to the impurity element providing an n-type, whereby high-concentration impurity regions 118 to 121 are formed in a self-alignment manner. An impurity element imparting an n-type is added to the high-concentration impurity regions 118 to 121 in a concentration of $1 \times 10^{20}$ to $1 \times 10^{21}/cm^3$.

Then, without removing the resist masks, second etching processing is conducted. Herein, etching is conducted for 25 seconds by using $SF_6$, $Cl_2$, and $O_2$ as etching gas (flow rate ratio: 24/12/24 (sccm)) with an RF power (13.56 MHZ) of 700 W supplied to a coil-shaped electrode at a pressure of 1.3 Pa to thereby generate plasma. An RF power (13.56 MHZ) of 10 W is also applied to the substrate side (sample stage), whereby a substantially negative self-bias voltage is applied thereto. In the second etching processing, an etching rate with respect to W is 227.3 nm/min., an etching rate with respect to TaN is 32.1 nm/min., and a selection ratio of W with respect to TaN is 7.1. An etching rate with respect to SiON that is the insulating film 106 is 33.7 nm/min., and a selection ratio of W with respect to TaN is 6.83. In the case of using $SF_6$ as the etching gas, a selection ratio with respect to the insulating film 106 is high, so that a decrease in a film thickness can be suppressed.

The taper angle of W becomes 70° in the second etching processing. Furthermore, in the second etching processing, second conductive layers 122b to 125b are formed. On the other hand, the first conductive layers are hardly etched to form first conductive layers 122a to 125a. (FIG. 1D) Although not shown, actually, the width of the first conductive layers is narrowed by about 0.15 μm (i.e., about 0.3 μm over the total line width) compared with the state before the second etching processing. Furthermore, the width of the second conductive layer in the channel length direction corresponds to the second width shown in the embodiment mode.

The electrode formed by the first conductive layer 122a and the second conductive layer 122b is to be the gate electrode of the n-channel TFT of the CMOS circuit formed by the following steps. The electrode formed by the first conductive layer 125a and the second conductive layer 125b is to be one electrode of the retention capacitor formed by the following steps.

It is also possible to use $CF_4$, $Cl_2$, and $O_2$ as the etching gas in the second etching processing. In this case, etching may be conducted by generating plasma under a flow rate ratio of 25/25/10 (sccm) with an RF power (13.56 MHZ) of 500 W supplied to a coil-shaped electrode at a pressure of 1 Pa. An RF power (13.56 MHZ) of 20 W is also applied to the substrate side (sample stage), whereby a substantially negative self bias voltage is applied thereto. In the case of using $CF_4$, $Cl_2$, and $O_2$, an etching rate with respect to W is 124.62 nm/min., an etching rate with respect to TaN is 20.67 nm/min., and a selection ratio of W with respect to TaN is 6.05. Thus, the W film is selectively etched. Furthermore, in this case, the regions of the insulating film 106, not covered with the conductive layers 122 to 125 of a first shape, are etched by about 50 nm to be thin.

Then, after removing the resist masks, second doping processing is conducted to obtain a state shown in FIG. 2A. Doping is conducted using the second conductive layers 122b to 125b as masks with respect to an impurity element so that the impurity element is added to the semiconductor layers below the taper portions of the first conductive layers. In this embodiment, phosphorus (P) is used as the impurity element, and plasma doping is conducted under the doping conditions of a dose amount of $1.5 \times 10^{14}/cm^2$, an acceleration voltage of 90 keV, an ion current density of 0.5 μA/$cm^2$, phosphine ($PH_3$) 5% hydrogen dilute gas, and a flow rate of 30 sccm. Thus, low-concentration impurity regions 127 to 136 are formed so as to be overlapped with the first conductive layers in a self-alignment manner. The concentration of phosphorus (P) added to the low-concentration impurity regions 127 to 136 is $1 \times 10^{17}$ to $1 \times 10^{19}/cm^2$, and the low-concentration impurity regions 127 to 136 have a concentration gradient in accordance with the thickness of the taper portions of the first conductive layers. In the semiconductor layer overlapped with the taper portion of the first conductive layer, an impurity concentration (P concentration) decreases gradually from the end of the taper portion of the first conductive layer inwardly. More specifically, in the second doping processing, a concentration distribution is formed. Furthermore, an impurity element is also added to the high-concentration impurity regions 118 to 121 to form high-concentration impurity regions 137 to 145.

In this embodiment, the width of the tapered portion (the width in the channel length direction) is preferably at least 0.5 μm or more and the upper limit thereof is 1.5 to 2 μm. Accordingly, though depending on the film thickness, the upper limit is also 1.5 to 2 μm for the width in the channel length direction of an impurity region (low concentration) having a concentration gradient. An impurity region (high concentration) and an impurity region (low concentration) are shown as separate regions in the drawing. In fact, there is no definite border but merely a region having a concentration gradient. Similarly, a channel formation region and an impurity region (low concentration) do not have a definite border between them.

Next, the area other than the pixel portion is covered with resist masks 146 and 147 to conduct third etching treatment. In the third etching treatment, the tapered portions of the first conductive layers are selectively etched so as to remove the regions that overlap the semiconductor layers. The third etching treatment uses as etching gas $Cl_3$ that has a high selective ratio with respect to W and employs an ICP etching device. In this embodiment, the gas flow rate of $Cl_3$ is set to 80 sccm and an RF (13.56 MHZ) power of 350 W is given to a coiled electrode at a pressure of 1.2 Pa to generate plasma for 30 second etching. The substrate side (sample stage) receives an RF (13.56 MHZ) power of 50 W to apply a substantially negative self-bias voltage. First conductive layer 124c is formed through the third etching. (FIG. 2B)

Although an example of executing the third etching treatment is showed in this embodiment, the third etching treatment is not necessary to perform here if there is no requirement.

Next, the resist masks 146 and 147 are removed to form a first interlayer insulating film 154. The first interlayer insulating film 154 is formed from an insulating film containing silicon to a thickness of 10 to 200 nm by plasma CVD or sputtering. The first interlayer insulating film 154 serves as an etching stopper to avoid over-etching of the semiconductor layers when contact holes are formed later in the insulating film reduced in thickness during the manufacture process. In this embodiment, a silicon oxide film with a thickness of 50 nm is formed by plasma CVD. The first interlayer insulating film 154 is not limited to the silicon oxide film, of course, and a single layer or laminate of other insulating films may also be used.

Next, the impurity elements used to dope the semiconductor layers are activated as shown in FIG. 2D. The activation is achieved by thermal annealing using an annealing furnace. The substrate is subjected to thermal annealing in a nitrogen atmosphere containing 1 ppm or less of oxygen, preferably 0.1 ppm or less of nitrogen atmosphere, at 400 to 700° C., typically 500 to 550° C. In this embodiment, the activation treatment is made through heat treatment at 550° C. for four hours. Other than thermal annealing, laser annealing or rapid thermal annealing (RTA) can be employed.

Though not shown in the drawing, the impurity elements are diffused through the activation treatment to thereby erase the border between the n-type impurity regions (low concentration) and the impurity regions (high concentration) almost completely.

In this embodiment, nickel used as the catalyst in crystallization is gettered and moved to the impurity regions containing a high concentration of phosphorus at the same time the above activation treatment is conducted. As a result, the nickel concentration in the semiconductor layers that mainly serve as the channel formation regions is reduced. If a channel formation region thus formed is used in a TFT, the TFT can have high field effect mobility and excellent characteristics owing to reduced OFF current value and improved crystallinity.

The activation treatment may be conducted before forming the first interlayer insulating film. However, when the wiring line material used is weak against heat, it is preferred to form the first interlayer insulating film (an insulating film mainly containing silicon, for example, a silicon nitride film) first and then conduct the activation treatment as in this embodiment to protect the gate electrodes.

Next, heat treatment is conducted in a hydrogen atmosphere to hydrogenate the semiconductor layers. Other hydrogenating methods that can be used include plasma hydrogenation (using hydrogen excited by plasma).

When laser annealing is employed for the activation treatment, the substrate is desirably irradiated with laser light of an excimer laser, a YAG laser, or the like after the above hydrogenation.

A source wiring line 126 is formed next on the first interlayer insulating film 154. (FIG. 3A) The source wiring line 126 is preferably formed of a low resistant material, typically, aluminum, silver, copper or a material mainly containing above materials.

The conductive film mainly containing aluminum is formed by a sputtering in this embodiment, thereafter, the source wiring line 126 is formed using a photolithography. In addition, as another method of manufacturing the source wiring line 126, the printing and the plating can be used.

Then a second interlayer insulating film 155 is formed so as to cover the source wiring of pixels. An inorganic insulating film mainly containing silicon may be used for the second interlayer insulating film 155.

Although a case of forming the source wiring line 126 on the first interlayer insulating film 154 is shown here, the source wiring line may be formed on the second interlayer insulating film. In this case, the second interlayer insulating film is formed using a silicon nitride film after the activation, heat treatment is conducted (at 300 to 550° C. for one to twelve hours) to hydrogenate the semiconductor layers, and then the source wiring line is formed on the second interlayer insulating film. The hydrogenation in this case is for terminating dangling bonds in the semiconductor layers with hydrogen contained in the second interlayer insulating film.

Next, a third interlayer insulating film 156 is formed on the second interlayer insulating film 155 from an organic insulating material. In this embodiment, an acrylic resin film is formed to a thickness of 1.6 μm. Then contact holes reaching the impurity regions (137, 138, 149, 150, 151, 153, and 144), a contact hole reaching the source wiring line 126 of pixel portions, contact holes reaching the gate electrodes 124 and contact holes reaching the electrode 125b are formed by patterning.

Formed next are electrodes 157 to 160 electrically connected to the impurity regions 137, 138, 149, and 150, respectively. Also formed is the source wiring of the driver circuit. Also formed are a pixel electrode 163 electrically connected to the impurity region 144 and to the impurity region 153, an electrode (connector electrode) 161 for electrically connecting the impurity region 151 that is to serve as a source region with the source wiring line 126 of the pixel portion, a gate wiring line 162 electrically connected to the gate electrodes 124, and a capacitor wiring 169 electrically connected to the electrode 125b. These electrodes and the pixel electrode are formed from a material having excellent reflectivity, such as a film mainly containing Al or Ag, or a laminate of a film mainly containing Al and a film mainly containing Ag.

The impurity regions 135, 136, 144, and 145 functioning as one of electrodes of a capacitor storage 207 are doped with an impurity element that imparts the n-type conductivity. The capacitor storage 207 is composed of electrodes 125*a* and 125*b* connected to the capacitor wiring 169 and the semiconductor layers with the insulating film 106 as dielectric.

In this way, a driving circuit 201 including a CMOS circuit 202 that is composed of an n-channel TFT 203 and an n-channel TFT 204 can be formed on the same substrate as that on which the pixel portion 205 having a pixel TFT 206 that is an n-channel TFT and the capacitor storage 207 is formed. (FIG. 3B) A substrate as this is called herein an active matrix substrate for conveniences' sake.

In this embodiment, the EEMOS circuit is structured by using the n-channel TFT 203 and the n-channel TFT 204 shown in FIG. 8A.

Figures 3A, 3B:
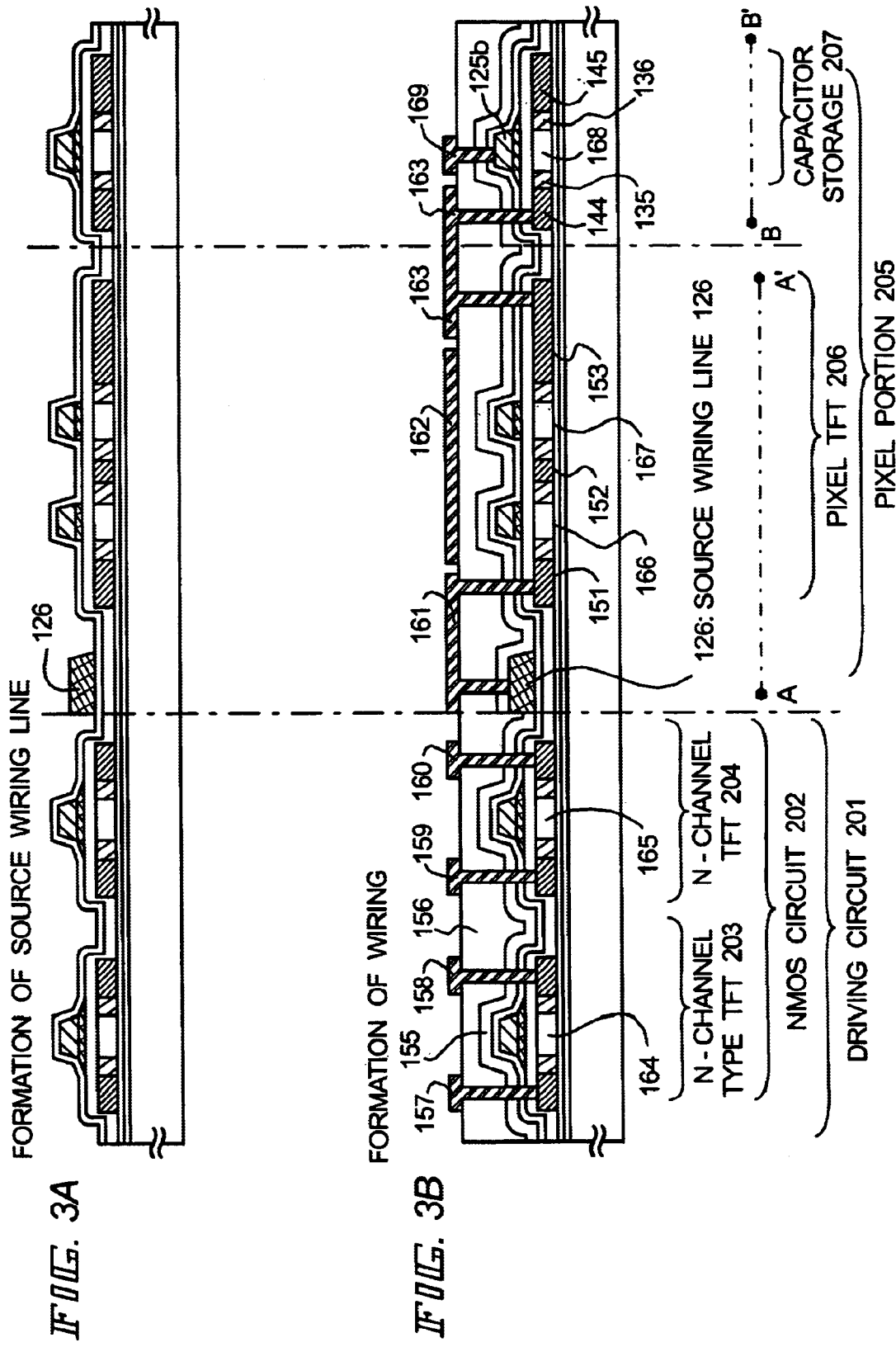
FIGS. 3A and 3B are diagrams showing another manufacturing process of AM-LCD.
Figure 4:
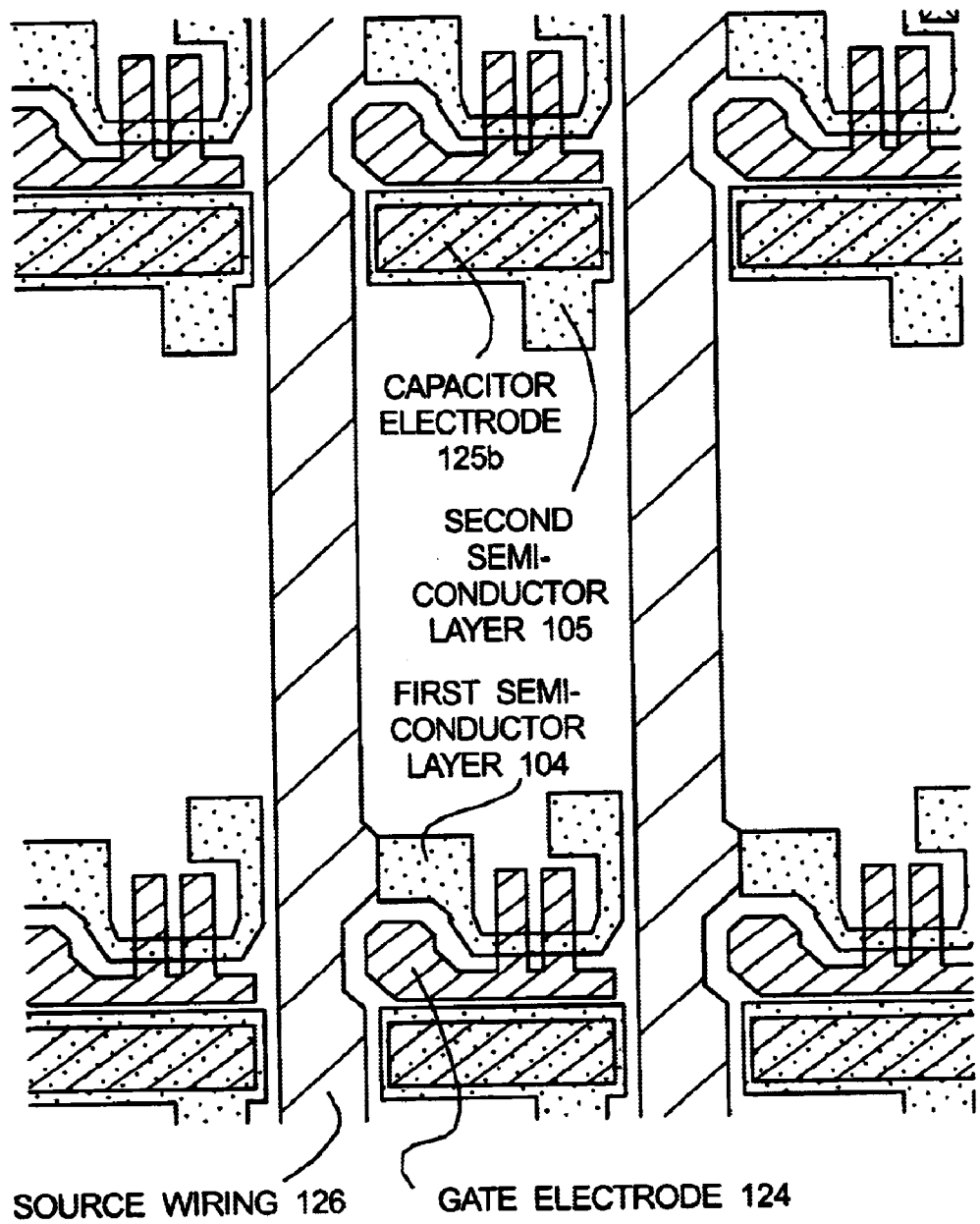
FIG. 4 is a top view of pixels.
Figure 5:
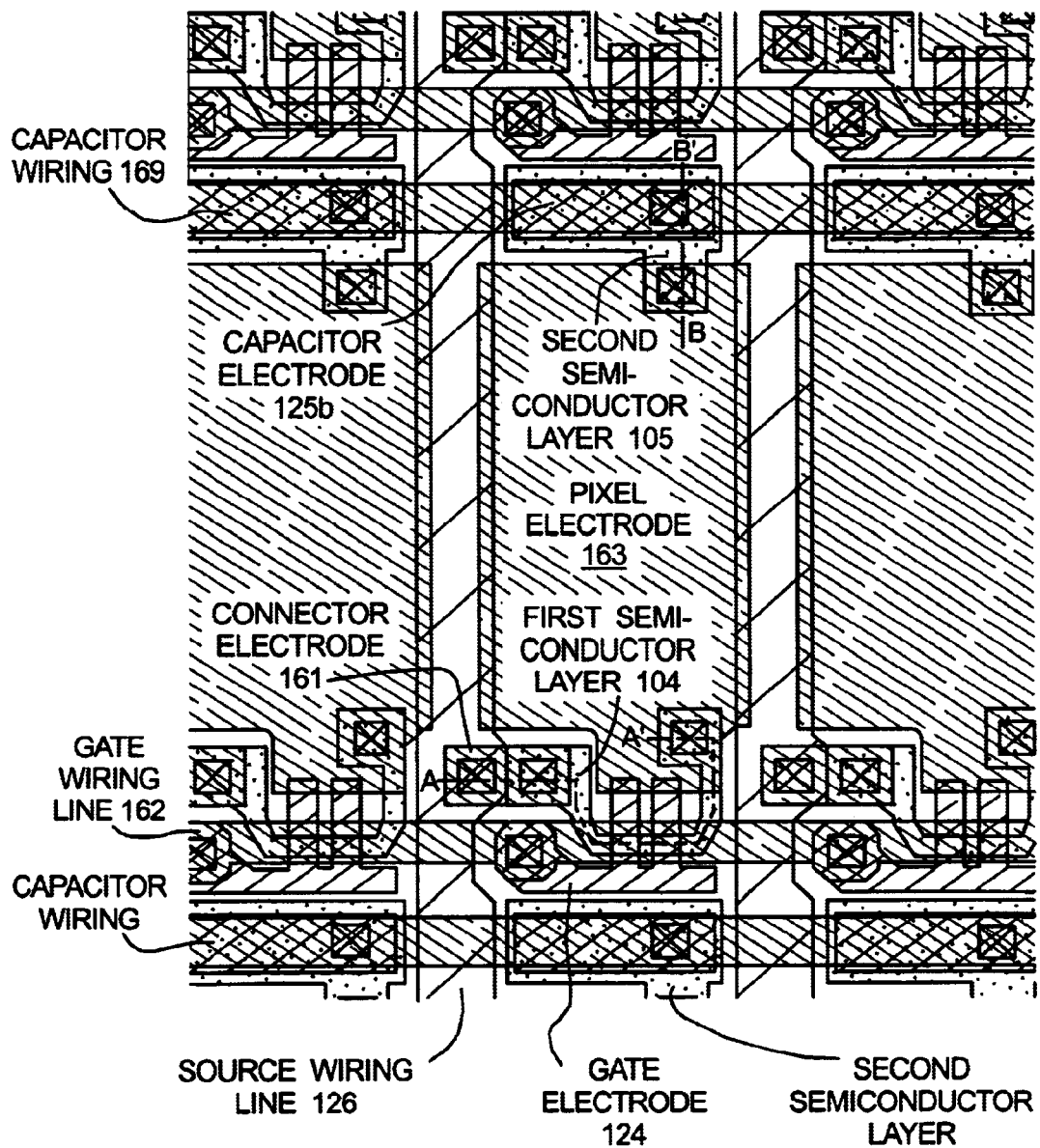
FIG. 5 is a top view of pixels.

FIG. 5 is a top view of the pixel portion of the active matrix substrate fabricated in accordance with this embodiment. In FIG. 5, components corresponding to those in FIG. 3B are denoted by the same symbols. The sectional view indicated by the dot-dash line A–A' in FIG. 3B is taken along the dot-dash line A–A' in FIG. 4. The sectional view indicated by the dot-dash line B–B' in FIG. 3B is taken along the dot-dash line B–B' in FIG. 5. The FIG. 4 shows a top view when just behind the source wiring 126 of the pixel is formed.

In the pixel structure according to this embodiment, the edge of the pixel electrode 163 overlaps the source wiring line 126 so that a gap between pixel electrodes is shielded against light without using a black matrix.

The process shown in this embodiment requires only six photo masks in manufacturing an active matrix substrate.

Second Embodiment

Figure 6:
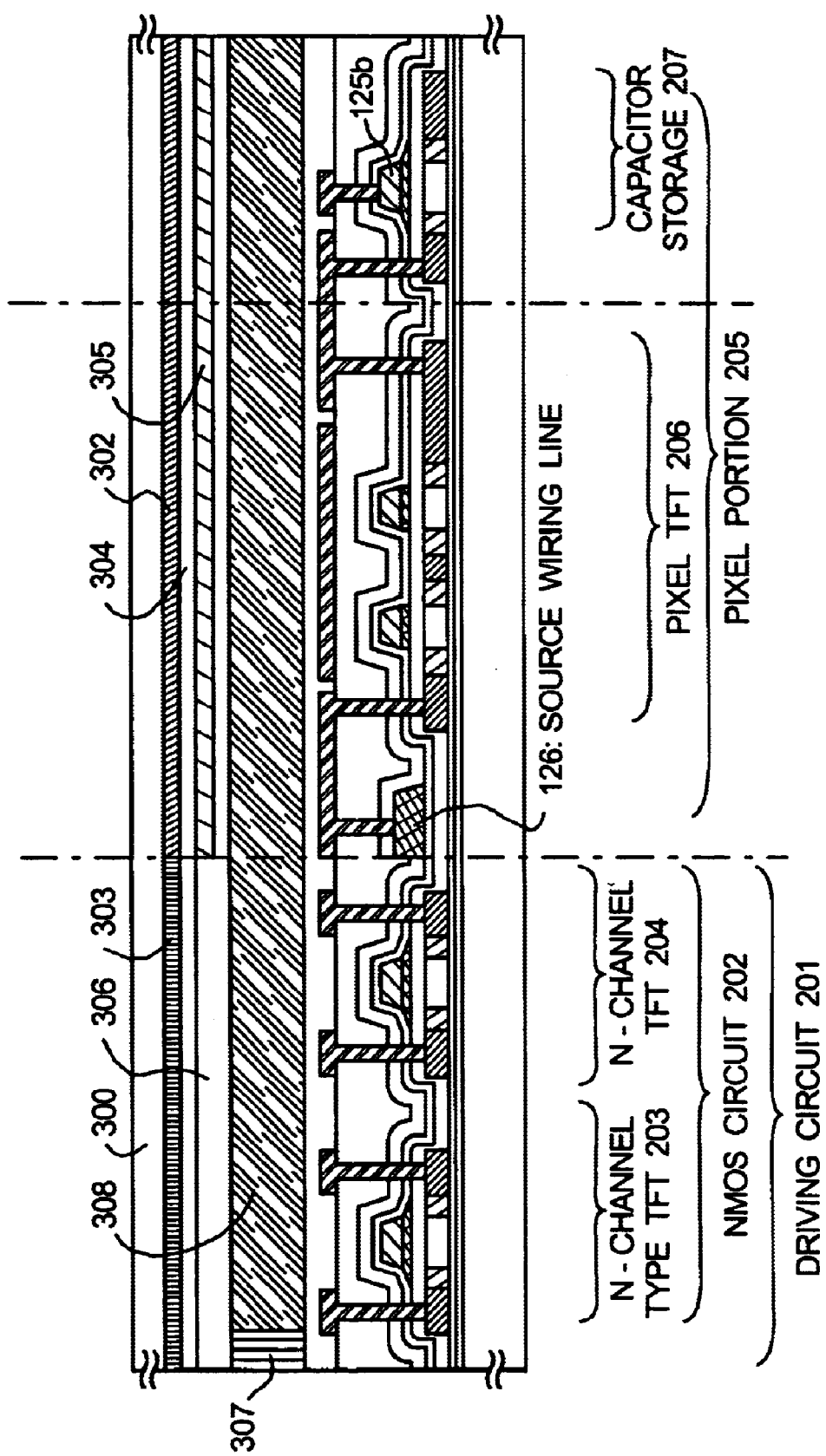
FIG. 6 is a cross-sectional view showing an active matrix type liquid crystal display device.

In this embodiment, a process for manufacturing an active matrix liquid crystal display device using the active matrix substrate manufactured in Embodiment 1 will be described. The description is made with reference to FIG. 6.

First, after the active matrix substrate with the state of FIG. 3B is obtained according to Embodiment 1, an orientation film 301 is formed on the active matrix substrate of FIG. 3B to perform a rubbing process. Note that, in this embodiment, before the formation of the orientation film 301, an organic resin film such as an acrylic resin film is patterned to form a columnar spacer for keeping a gap between substrates in a desired position. Also, instead of the columnar spacer, a spherical spacer may be distributed over the entire surface.

Next, an opposing substrate 300 is prepared. A color filter in which a colored layer 302 and a light shielding layer 303 are arranged corresponding to each pixel is provided in this opposing substrate 300. Also, a light shielding layer 303 is provided in a portion of a driver circuit. A leveling film 304 for covering this color filter and the light shielding layer 303 is provided. Next, a counter electrode 305 made of a transparent conductive film is formed in a pixel portion on the leveling film 304, and then an orientation film 306 is formed on the entire surface of the opposing substrate 300 to perform a rubbing process.

Then, the active matrix substrate in which the pixel portion and the driver circuit are formed and the opposing substrates are adhering to each other by using a sealing member 307. The filler is mixed with the sealing member 307, and two substrates are adhering to each other with a uniform interval by this filler and the columnar spacer. After that, a liquid crystal material 308 is injected into a space between both substrates and then completely encapsulated by a sealing member (not shown). A known liquid crystal material may be used as the liquid crystal material 308. Thus, the active matrix liquid crystal display device as shown in FIG. 5 is completed. If necessary, the active matrix substrate or the opposing substrate is cut with a predetermined shape. Also, a polarization plate and the like are suitably provided using a known technique. And, an FPC is adhering to the active matrix liquid crystal display device using a known technique.

A structure of a liquid crystal module thus obtained will be described using a top view of FIG. 7. Note that the same reference symbols are used for portions corresponding to those of FIG. 6.

The top view of FIG. 7 shows the state that the active matrix substrate and the opposing substrate 300 are adhering to each other through the sealing member 307. Over the active matrix substrate, an external input terminal 309 to which the pixel portion, the driver circuit, and the FPC (flexible printed circuit) are adhering, a wiring 310 for connecting the external input terminal 309 with an input portion of the respective circuits, and the like are formed. Also, the color filter and the like are formed in the opposing substrate 300.

A light shielding layer 303*a* is provided in the opposing substrate side so as to overlap with a gate wiring side driver circuit 201*a*. Also, a light shielding layer 303*b* is provided in the opposing substrate side so as to overlap with a source wiring side driver circuit 201*b*. In a color filter 302 which is provided over the opposing substrate side on a pixel portion 205, a light shielding layer and colored layers for respective colors red color (R), green color (G), and blue color (B) are provided corresponding to each pixel. Actually, a color display is formed using three colors, that is, the colored layer for the red color (R), the colored layer for the green color (G), and the colored layer for the blue color (B). Note that the colored layers for respective colors are arbitrarily arranged.

Here, for a color display, the color filter 302 is provided over the opposing substrate. However, the present invention is not particularly limited to this case, and in manufacturing the active matrix substrate, the color filter may be formed over the active matrix substrate.

Also, in the color filter, the light shielding layer is provided between adjacent pixels such that a portion except for a display region is shielded. The light shielding layers 303*a* and 303*b* are provided in a region covering the driver circuit. However, when the liquid crystal display device is incorporated into an electronic device as a display portion thereof, the region covering the driver circuit is covered with a cover. Thus, the color filter may be constructed without the light shielding layer. In manufacturing the active matrix substrate, the light shielding layer may be formed over the active matrix substrate.

Also, without providing the light shielding layer, the colored layers composing the color filter may be suitably arranged between the opposing substrate and the counter electrode such that light shielding is made by a lamination layer laminated with a plurality of layers. Thus, the portion except for the display region (gaps between pixel electrodes) and the driver circuit may be light-shielded.

Also, the FPC 411 which is composed of the base film and the wiring is adhering to the external input terminal by using an anisotropic conductive resin. Further, a reinforced plate is provided to increase a mechanical strength.

The liquid crystal module manufactured above can be used as the display portion of various electronic equipments.

Third Embodiment

With respect to the n-channel type TFT of the first embodiment, the enhancement type and the depression type can be discriminatively formed by doping an element belonging to the fifteenth group of the periodic table (preferably, phosphorus) or an element belonging to the thirteenth group of the periodic table (preferably, boron) into the semiconductor serving as the channel-forming region.

Further, in the case where an NMOS circuit is formed by combining n-channel type TFTs, there are two cases, one case where it is formed by enhancement type TFTs (hereinafter referred to as "EEMOS circuit") and the other case where it is formed by combining an enhancement type and a depression type (hereinafter referred to as "EDMOS circuit").

Here, FIG. 8A shows a case of the EEMOS circuit, and FIG. 8B shows a case of the EDMOS circuit. In FIG. 8A, each of reference numerals 31 and 32 represents an enhancement type n-channel type TFT (hereinafter referred to as "E-type NTFT"). In FIG. 8B, reference numeral 33 represents an E-type NTFT, and reference numeral 34 represents a depression type n-channel type TFT (hereinafter referred to as "D-type NTFT").

In FIGS. 8A and 8B, VDH represents a voltage source line (positive voltage source line) to which a positive voltage is applied, and VDL represents a voltage source line (negative voltage source line) to which a negative voltage is applied. The negative voltage source line may be a power source line of the ground potential (i.e., ground voltage source line).

Figure 9A:
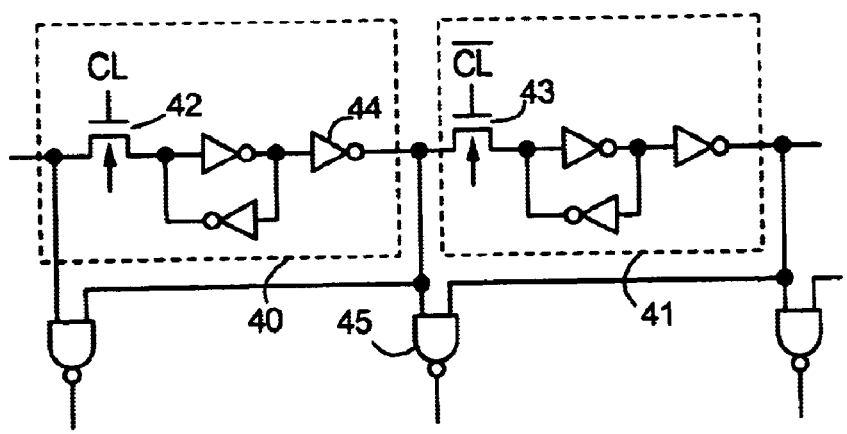
FIGS. 9A and 9B are diagrams showing the construction of a shift register.
Figure 9B:
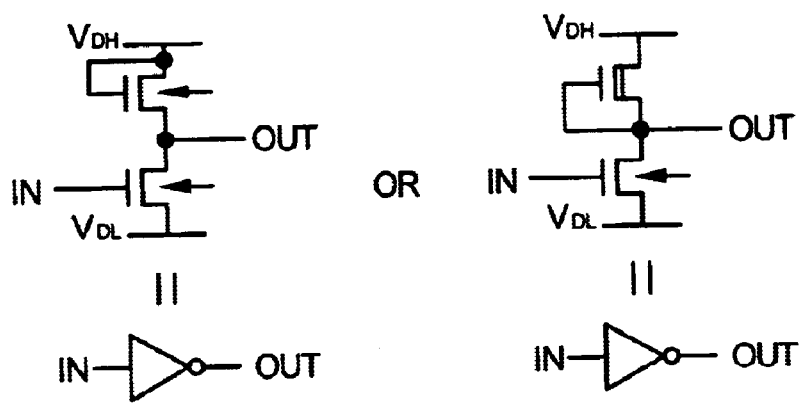

FIG. 9 shows a case where a shift resister is formed by using an EEMOS circuit shown in FIG. 8A or an EDMOS circuit shown in FIG. 8B. In FIG. 9, reference numerals 40, 41 represent flip flop circuits. Further, reference numerals 42, 43 represent E-type NTFTs. A clock signal (CL) is input to the gate of the E-type NTFT 42, and a clock signal (CL bar) having the inverted polarity is input to the gate of the E-type NTFT 43. Reference numeral 44 represents an inverter circuit, and the EEMOS circuit shown in FIG. 8A or the EDMOS circuit shown in FIG. 8B is used as shown in FIG. 9B. Accordingly, the overall driving circuit of the display device can be constructed by n-channel type TFTs.

This embodiment may be freely combined with the first embodiment or the second embodiment.

Fourth Embodiment

Figure 10:
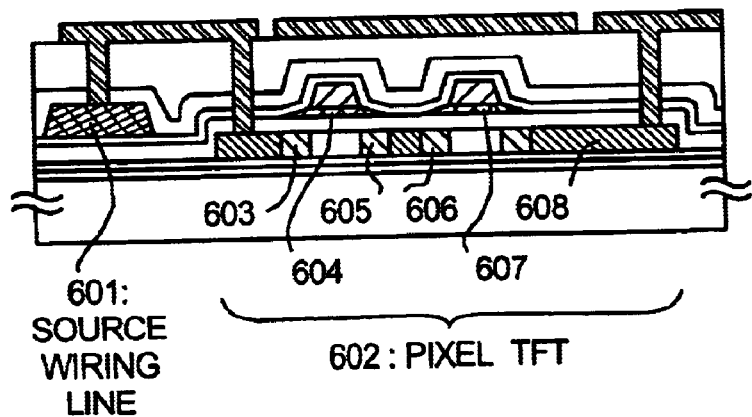
FIG. 10 is a cross-sectional view showing a pixel portion.

In this embodiment, a gate electrode different from that of the first embodiment is provided in the pixel TFT as shown in FIG. 10. In FIG. 10, only the pixel portion is illustrated because only the gate electrode of the pixel portion is different from that of the first embodiment.

In this embodiment, the third etching treatment of the first embodiment shown in FIG. 2B is not carried out. Accordingly, the first conductive layer 604 is overlapped with the impurity region 603, 605 through the insulating film, and the first conductive layer 607 is overlapped with the impurity region 606, 608 through the insulating film.

The first conductive layer 604, 607 having the tapered portion corresponds to the first conductive layer 124a of the first embodiment.

According to this embodiment, the number of mask sheets can be reduced by one as compared with the first embodiment, and the number of photomask sheets needed to form an active matrix board can be reduced to five.

This embodiment may be freely combined with any one of the first to third embodiments.

Fifth Embodiment

In the first embodiment, the method of manufacturing an active matrix board used in a reflection type liquid crystal display device is described. In this embodiment, a method of manufacturing an active matrix board used in a transmission type liquid crystal display will be described. In FIG. 11, only the pixel portion is illustrated in FIG. 11 because only the pixel portion is different.

Figure 11A:
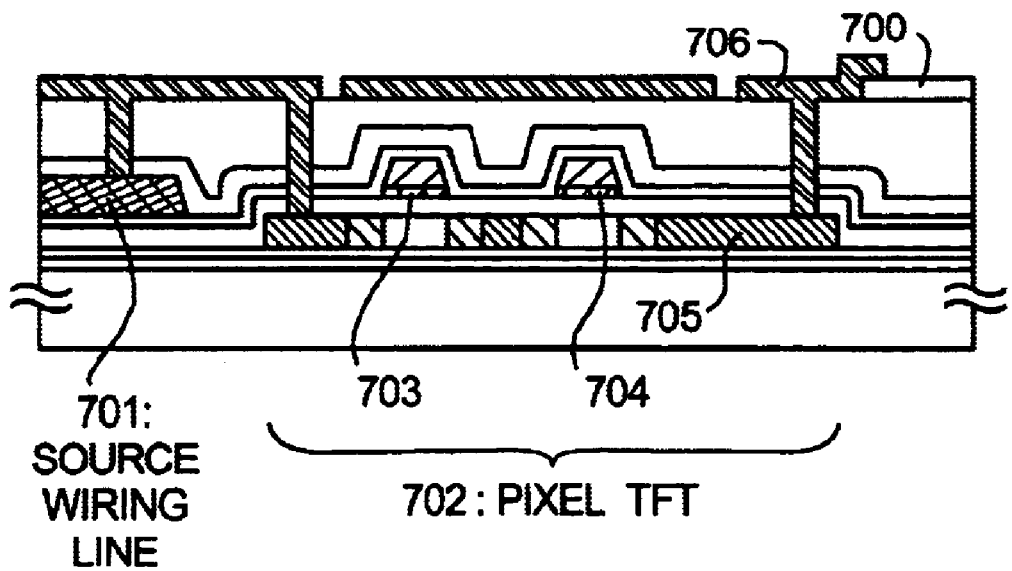
FIGS. 11A and 11B are cross-sectional views showing the pixel portion.

FIG. 11A shows a process in which according to the first embodiment, after a third interlayer insulating film is formed, a pixel electrode 700 comprising a transparent conductive film is subjected to a patterning treatment using a photomask to form contact holes and form each of the electrodes and the gate wires. The transparent conductive film of the pixel electrode 700 may be formed of ITO (alloy of indium oxide and tin oxide), alloy of indium oxide and zinc oxide ($In_2O_3$—ZnO), zinc oxide (ZnO) or the like.

The pixel electrode 700 is electrically connected to an impurity region 705 of a pixel TFT 702 by a connection electrode 706 overlapped with the pixel electrode 700. In FIG. 11A, reference numeral 701 represents a source wire, and reference numerals 703, 704 represent gate electrodes. In this embodiment, the connection electrode is formed after the pixel electrode is formed. However, after the contact hole is formed and the connection electrode is formed, the pixel electrode comprising the transparent conductive film may be formed so as to be overlapped with the connection electrode.

In the manufacturing method of achieving the structure of FIG. 11A, the number of photomasks needed to manufacture an active matrix board can be set to seven.

Figure 11B:
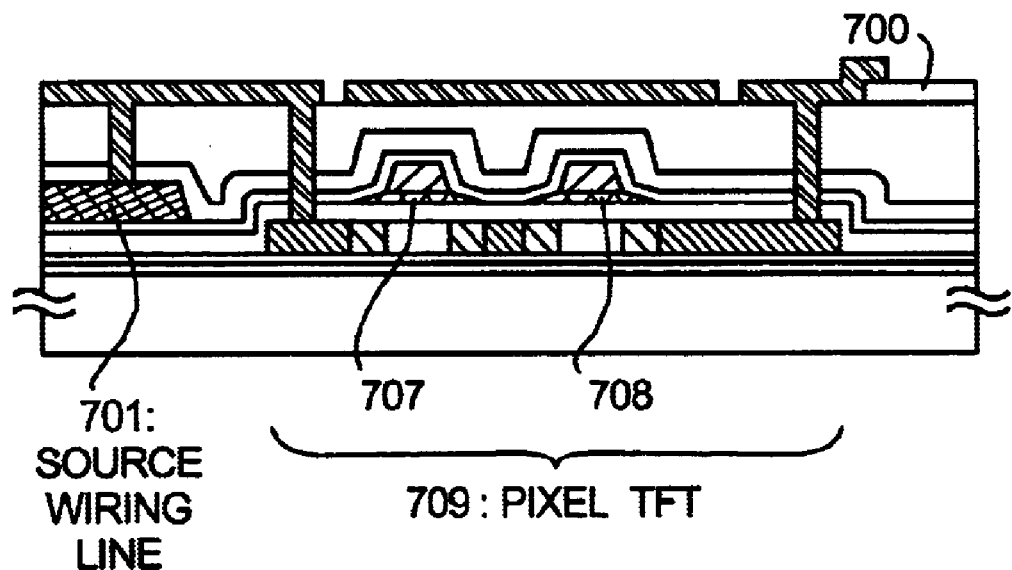

FIG. 11B shows a method of forming an active matrix board used in a transmission type liquid crystal display device using the pixel TFT 709 achieved by the fourth embodiment. The same parts as FIG. 1A are represented by the same reference numerals.

In FIG. 11B, the gate electrode of the pixel TFT 709 forms the pixel electrode 700 comprising the transparent conductive film like FIG. 11A.

In FIG. 11B, the structure of the gate electrode is different from that of FIG. 11A, and each of first conductive layers 707, 708 has a tapered portion.

In the manufacturing method of achieving the structure of FIG. 11B, the number of photomasks needed to form an active matrix board can be reduced to six.

This embodiment may be freely combined with any one of the first to fourth embodiments.

Sixth Embodiment

Figure 12:
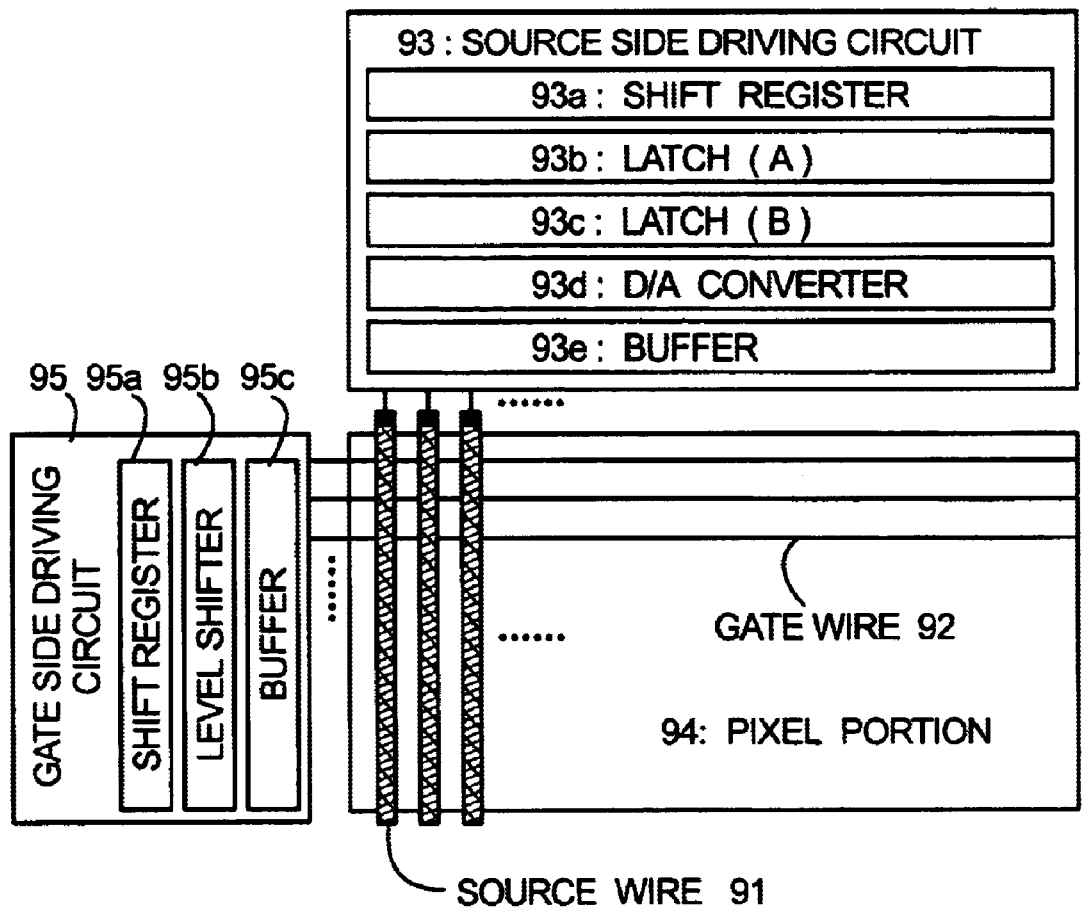
FIG. 12 is a top view of the device.

This embodiment is characterized in that the source wires of the pixel portion and the source wires of the driving circuit are formed in different processes. In the following description, only the different points will be described in more detail with reference to FIG. 12. In FIG. 12, only three source wires 91 and only three gate wires 92 of the pixel portion are illustrated in order to simplify the description. The source wires 91 of the pixel portion are designed as bands arranged in parallel, and the interval thereof is equal to the pixel pitch.

FIG. 12 is also a block diagram to perform a digital driving operation. In this embodiment, a source side driving circuit 93, a pixel portion 94 and a gate side driving circuit 95 are provided. In the specification, the driving circuit is a general term containing a source side driving circuit and a gate side driving circuit.

The source side driving circuit 93 comprises a shift register 93a, a latch (A) 93b, a latch (B) 93c, a D/A converter 93d and a buffer 93e. The gate side driving circuit 95 comprises a shift register 95a, a level shifter 95b and a buffer 95c. If necessary, a level shifter circuit may be provided between the latch (B) 93c and the D/A converter 93d.

In this embodiment, a contact portion exists between the source side driving circuit 93 and the pixel portion 94 as shown in FIG. 12. This is because the source wires of the source side driving circuit and the source wires 91 of the pixel portion are formed in the different processes. In this embodiment, the source wires of the pixel portion are formed of material having low resistance, and thus they are formed in the process different from that of the source wires of the source side driving circuit.

In the first embodiment, the source wires 91 of the pixel portion are formed by using the sputtering method, and then etched by using the photolithography method.

In this embodiment, the source wires 91 of the pixel portion are formed by using another method (plating method, print method).

Figure 13A:
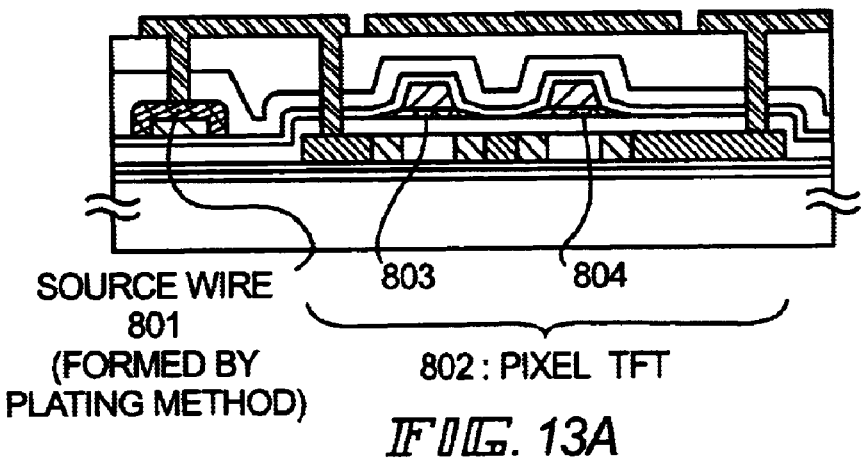
FIGS. 13A to 13C are cross-sectional views showing the pixel portion.

FIG. 13A shows a case where source wires 801 of the pixel portion are formed by using the plating method (electroplating method). The source wires 801 of the pixel portion are formed in a layer different from that of the gate electrodes 803, 804.

According to the plating method, DC current is supplied into water solution containing metal ions (plating material source) to form a metal film on a cathode surface. As metal to be plated may be used copper, silver, gold, chromium, iron, nickel, platinum or alloy thereof, for example.

In the plating method, the film thickness may be suitably set under the control of current density and a plating time by an executor.

In this embodiment, the wires are formed on the first interlayer insulating film by using the photolithography method, and then a metal film (copper) is formed on the surface of each wire by the plating method to complete the source wires. The copper is optimum to the source wires of the present invention because the electrical resistance thereof is very low. In the subsequent steps, a pixel TFT 802 shown in FIG. 13A can be formed according to the method of the first embodiment.

Figure 13B:
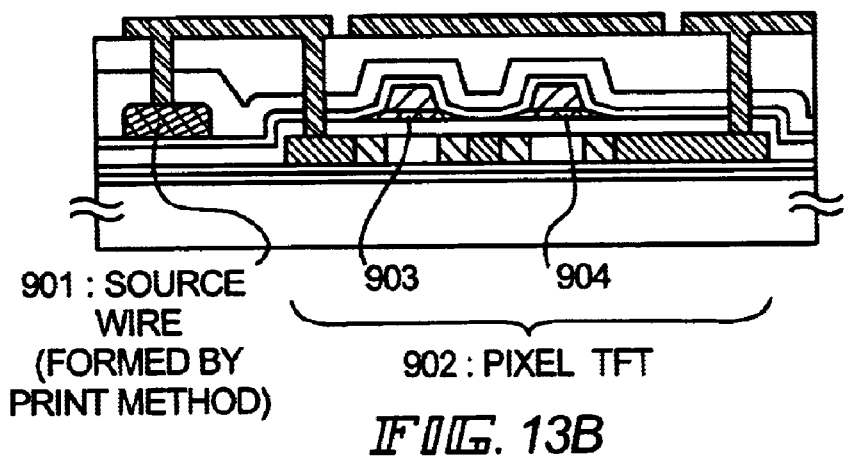

FIG. 13B shows a case where the source wires 901 of the pixel portion are formed by using the print method (screen print method).

According to the screen print, a plate having a desired opening pattern is used as a mask, and paste (diluent) or ink mixed with metal particles (Ag, Al or the like) is formed on a substrate serving as a print medium through the opening portion of the mask, and then the substrate thus printed is burned to form wires having a desired pattern. The print method as described above is relatively low in cost and can provide a large-area print pattern, and hence, is suitable of the invention.

In this embodiment, only the source wires of the pixel portion are formed in the line direction on the first interlayer insulating film using the screen print method. The source wires 901 of the pixel portion are formed in the layer different from that of the gate electrodes 903, 904.

In the manufacturing method of achieving the structure of FIG. 13B, the number of photomasks needed to form the active matrix board can be reduced to four.

Figure 13C:
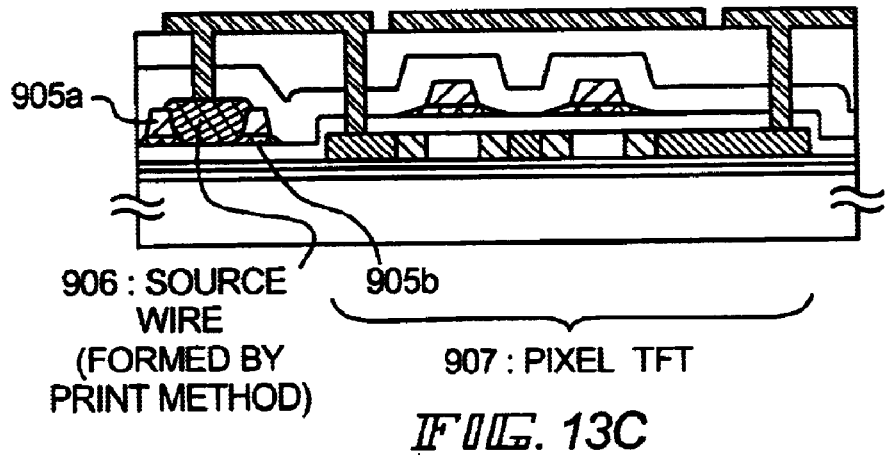

FIG. 13C shows a case where source wires 906 of the pixel portion are formed in the same layer as the gate electrodes by using the print method (screen print method). In the following case, conductive layers 905a, 905b are provided to enhance the positional precision of the source wires 906 of the pixels.

In this embodiment, the conductive layers 905a, 905b are formed in the same process as the gate electrodes. Subsequently, the impurity elements are activated while the gate electrodes are not covered by the insulating film. As an activating method, a thermal annealing treatment is carried out under reduced pressure in an inert atmosphere so that increase of resistance of the conductive layers due to oxidation of the conductive layers can be suppressed. Subsequently, the source wires 906 are formed so as to be filled between the conductive layers 905a, 905b by using the print method. The wire breaking which is liable to occur in the print method can be prevented by providing the conductive layers 905a, 905b along the source wires 906.

In place of the screen print method, a letterpress printing method using a rotating drum, an intaglio printing method and various offset printing methods may be applied to the present invention.

The source wires 91 of the pixel portion can be formed by the various methods as described above.

The pixel portion 94 contains plural pixels, and a TFT element is provided to each of the plural pixels. Further, many gate wires 92 connected to the gate side driving circuit are provided to the pixel portion 94 in parallel to one another.

A gate side driving circuit may be also provided at the opposite side to the gate side driving circuit 95 with respect to the pixel portion 94. Further, when the device is driven in the analog style, a sampling circuit may be provided in place of the latch circuit.

The above construction can be implemented according to the manufacturing processes of the first to fifth embodiments.

Seventh Embodiment

The driver circuit and the pixel portion in accordance with the present invention can be used in various modules (active matrix type liquid crystal module, active matrix type EL module and active matrix type EC module). In other words, the present invention can be applied to all of the electronic equipments having these modules as the display section.

The following can be given as examples of the electronic equipment: video cameras; digital cameras; head mounted displays (goggle type display); car navigation systems; projectors; car stereo; personal computers; portable information terminals (such as mobile computers, portable telephones and electronic notebook). An example of these is shown in FIGS. 15 and 16.

FIG. 15A shows a personal computer, and it includes a main body 2001, an image input section 2002, a display portion 2003, and a keyboard 2004. The present invention is applicable to the display portion 2003.

FIG. 15B shows a mobile computer, and it includes a main body 2201, a camera section 2202, an image receiving section 2203, operation switches 2204, and a display portion 2205. The present invention is applicable to the display portion 2205.

FIG. 15C shows a player using a recording medium which records a program (hereinafter referred to as a recording medium), and it includes a main body 2401; a display portion 2402; a speaker section 2403; a recording medium 2404; and operation switches 2405. This player uses DVD (digital versatile disc), CD, etc. for the recording medium, and can be used for music appreciation, film appreciation, games and Internet. The present invention is applicable to the display portion 2402.

FIG. 16A shows a portable book (electronic book), and it includes a main body 3001, display portions 3002 and 3003, a recording medium 3004, operation switches 3005, and an antenna 3006. The present invention can be applied to the display portions 3002 and 3003.

FIG. 16B shows a display, and it includes a main body 3101, a support stand 3102, and a display portion 3103. The present invention can be applied to the display portion 3103.

The applicable range of the present invention is thus extremely wide, and it is possible to apply the present invention to electronic equipment in all fields. Further, the electronic equipment of the embodiment 7 can be realized by using a constitution of any combination of Embodiments 1 to 6.

As described above, according to the present invention, lower power consumption can be performed for a semiconductor device represented by an active matrix type liquid crystal display device even when the area of the pixel portion is increased and thus the semiconductor device has a large-scale screen.

What is claimed is:

1. A method of manufacturing a semiconductor device having a driving circuit and a pixel portion over an insulating surface, the method comprising:

forming a semiconductor layer over the insulating surface;

forming a first insulating film over the semiconductor layer;

forming a gate electrode over the first insulating film;

doping first impurity elements at a first concentration providing n-type into the semiconductor layer using the gate electrode as a mask to form a first n-type impurity region;

etching the gate electrode to form a tapered portion of the gate electrode;

doping second impurity elements at a second concentration smaller than the first concentration providing n-type into the semiconductor layer having the first n-type impurity region while passing through the tapered portion of the gate electrode to form a second n-type impurity region between the first n-type impurity region and a channel-forming region;

forming a second insulating film so as to cover the gate electrode;

forming a source wire of the pixel portion over the second insulating film;

forming a third insulating film so as to cover the source wire of the pixel portion; and forming a source wire of the driving circuit and a gate wire of the pixel portion over the third insulating film.

2. A method according to claim 1, wherein a pixel electrode is formed at the same time as the source wire of the driving circuit.

3. A method according to claim 1, wherein the source wire of the pixel portion is formed by a sputtering method, a print method, a plating method or a combination thereof.

4. A method according to claim 1, wherein the gate electrode has a laminate structure comprising a first conductive layer having a first width as a lower layer and a second conductive layer having a second width smaller than the first width as an upper layer.

5. A method according to claim 4, wherein a sectional shape of an area of the first conductive layer that is not overlapped with the second conductive layer is a tapered shape.

6. A method of manufacturing a semiconductor device having a first n-channel type TFT and a second n-channel type TFT, the method comprising:

forming a first semiconductor layer and a second semiconductor layer over an insulating surface to form the first n-channel type TFT and the second n-channel type TET respectively;

forming a first insulating film over the first semiconductor layer and the second semiconductor layer;

forming a first gate electrode and a second gate electrode over the first semiconductor layer and the second semiconductor layer respectively with the first insulating film interposed therebetween;

doping first impurity elements providing n-type into the first semiconductor layer and the second semiconductor layer using the first gate electrode and the second gate electrode as masks to form a first n-type impurity region in the first semiconductor layer and a second n-type impurity region in the second semiconductor layer;

etching the first gate electrode and the second gate electrode to form a first tapered portion of the first gate electrode and a second tapered portion of the second gate electrode;

doping second impurity elements providing n-type into the first semiconductor layer having the first n-type impurity region and the second semiconductor layer having the second n-type impurity region while passing through the first tapered portion of the first gate electrode and the second tapered portion of the second gate electrode to form a third n-type impurity region between the first n-type impurity region and a first channel-forming region of the first n-channel type TFT and a fourth n-type impurity region between the second n-type impurity region and a second channel-forming region of the second n-channel type TFT;

seletively removing the second tapered portion of the second gate electrode to form a third gate electrode;

forming a second insulating film so as to cover the second gate electrode and the third gate electrode;

forming a source wire of a pixel portion over the second insulating film;

forming a third insulating film so as to cover the source wire of the pixel portion; and forming a source wire of a driving circuit and a gate wire of the pixel portion over the third insulating film.

7. A method according to claim 6, wherein the first n-channel type TFT having the first gate electrode is a TFT of the driving circuit.

8. A method according to claim 6, wherein the second n-channel type TFT having the third gate electrode is a TFT of the pixel portion.

9. A method according to claim 6, wherein a pixel electrode is formed at the same time as the source wire of the driving circuit.

10. A method according to claim 6, wherein the source wire of the pixel portion is formed by a sputtering method, a print method, a plating method or a combination thereof.

11. A method according to claim 6, wherein the first gate electrode has a laminate structure comprising a first conductive layer having a first width as a lower layer and a second conductive layer having a second width smaller than the first width as an upper layer.

12. A method according to claim 11, wherein a sectional shape of an area of the first conductive layer that is not overlapped with the second conductive layer is a tapered shape.

13. A method of manufacturing a semiconductor device having a driving circuit and a pixel portion over an insulating surface, the method comprising:

forming a semiconductor layer over the insulating surface;

forming a first insulating film over the semiconductor layer;

forming a gate electrode over the first insulating film;

doping first impurity elements at a first concentration providing n-type into the semiconductor layer using the gate electrode as a mask to form a first n-type impurity region;

etching the gate electrode to form a tapered portion of the gate electrode;

doping second impurity elements at a second concentration smaller than the first concentration providing n-type into the semiconductor layer having the first n-type impurity region while passing through the tapered portion of the gate electrode to form a second n-type impurity region between the first n-type impurity region and a channel-forming region;

forming a second insulating film so as to cover the gate electrode; and forming a source wire in the driving circuit and a gate wire in the pixel portion over the second insulating film.

14. A method according to claim 13, wherein the gate electrode has a laminate structure comprising a first conductive layer having a first width as a lower layer and a second conductive layer having a second width smaller than the first width as an upper layer.

15. A method according to claim 14, wherein a sectional shape of an area of the first conductive layer that is not overlapped with the second conductive layer is a tapered shape.

16. A method of manufacturing a semiconductor device having a first n-channel type TFT and a second n-channel type TFT, the method comprising:

forming a first semiconductor layer and a second semiconductor layer over an insulating surface to form the first n-channel type TFT and the second n-channel type TFT respectively;

forming a first insulating film over the first semiconductor layer and the second semiconductor layer;

forming a first gate electrode and a second gate electrode over the first semiconductor layer and the second semiconductor layer respectively with the first insulating film interposed therebetween;

doping first impurity elements providing n-type into the first semiconductor layer and the second semiconductor layer using the first gate electrode and second gate electrode as masks to form a first n-type impurity region in the first semiconductor layer and a second n-type impurity region in the second semiconductor layer;

etching the first gate electrode and the second gate electrode to form a first tapered portion of the first gate electrode and a second tapered portion of the second gate electrode;

doping second impurity elements providing n-type into the first semiconductor layer having the first n-type impurity region and the second semiconductor layer having the second n-type impurity region while passing through the first tapered portion of the first gate electrode and the second tapered portion of the second gate electrode to form a third n-type impurity region between the first n-type impurity region and a first channel-forming region of the first n-channel type TFT and a fourth n-type impurity region between the second n-type impurity region and a second channel-forming region of the second n-channel type TFT;

selectively removing the second tapered portion of the second gate electrode to form a third gate electrode; and forming a second insulating film so as to cover the second gate electrode and the third gate electrode.

17. A method according to claim 16, wherein the first n-channel type TFT having the first gate electrode is a TFT of the driving circuit.

18. A method according to claim 16, wherein the second n-channel type TFT having the third gate electrode is a TFT of the pixel portion.

19. A method according to claim 16, wherein the first gate electrode has a laminate structure comprising a first conductive layer having a first width as a lower layer and a second conductive layer having a second width smaller than the first width as an upper layer.

20. A method according to claim 19, wherein a sectional shape of an area of the first conductive layer that is not overlapped with the second conductive layer is a tapered shape.

21. A method according to claim 19, wherein a sectional shape of the portion of the gate electrode consisting of the first conductive layer is a tapered shape.

22. A method of manufacturing a semiconductor device over an insulating surface, the method comprising:

forming a semiconductor layer over the insulating surface;

forming a first insulating film over the semiconductor layer;

forming a gate electrode containing a first conductive layer and a second conductive layer formed on the first conductive layer over the first insulating film;

doping first impurity elements at a first ding n-type into the semiconductor layer using the gate electrode as a mask to form a first n-type impurity region;

selectively etching a part of the second conductive layer to form a portion of the gate electrode consisting of the first conductive layer;

doping second impurity elements at a second concentration smaller than the first concentration providing n-type into the semiconductor layer having the first n-type impurity region while passing through the portion of the gate electrode to form a second n-type impurity region between the first n-type impurity region and a channel-forming region;

forming a second insulating film so as to cover the gate electrode;

forming a source wire of a pixel portion over the second insulating film;

forming a third insulating film so as to cover the source wire of the pixel portion; and forming a source wire of a driving circuit and a gate wire of the pixel portion over the third insulating film.

23. A method according to claim 22, wherein a pixel electrode is formed at the same time as the source wire of the driving circuit.

24. A method according to claim 22, wherein the source wire of the pixel portion is formed by a sputtering method, a print method, a plating method or a combination thereof.

25. A method according to claim 22, wherein the second conductive layer has a first width and the second conductive layer has a second width smaller than the first width.

26. A method of manufacturing a semiconductor device having a first n-channel type TFT and a second n-channel type TFT, the method comprising:

forming a first semiconductor layer and a second semiconductor layer over an insulating surface to form the first n-channel type TFT and the second n-channel type TFT respectively;

forming a first insulating film over the first semiconductor layer and the second semiconductor layer;

forming a first gate electrode and a second gate electrode each containing a first conductive layer and a second conductive layer formed on the first conductive layer over the first semiconductor layer and the second semiconductor layer respectively with the first insulating film interposed therebetween;

doping first impurity elements providing n-type into the first semiconductor layer and the second semiconductor layer using the first gate electrode and second gate electrode as masks to form a first n-type impurity region in the first semiconductor layer and a second n-type impurity region in the second semiconductor layer;

selectively etching parts of the second conductive layer to form a first portion of the first gate electrode and a second portion of the second gate electrode each consisting of the first conductive layer;

doping second impurity elements providing n-type into the first semiconductor layer having the first n-type impurity region and the second semiconductor layer having the second n-type impurity region while passing through the first portion of the first gate electrode and the second portion of the second gate electrode each consisting of the first conductive layer to form a third n-type impurity region in the first semiconductor layer and a fourth n-type impurity region in the second semiconductor layer;

selectively removing e second portion of the second gate electrode consisting of the first conductive layer to form a third gate electrode;

forming a first insulating film so as to cover the second gate electrode and the third gate electrode;

forming a source wire of a pixel portion over the second insulating film;

forming a third insulating film so as to cover the source wire of the pixel portion; and forming a source wire of a driving circuit and a gate wire of the pixel portion over the third insulating film.

27. A method according to claim 26, wherein the first n-channel type TFT having the first gate electrode is a TFT of the driving circuit.

28. A method according to claim 26, wherein the second n-channel type TFT having the third gate electrode is a TFT of the pixel portion.

29. A method according to claim 26, wherein a pixel electrode is formed at the same time as the source wire of the driving circuit.

30. A method according to claim 26, wherein the source wire of the pixel portion is formed by a sputtering method, a print method, a plating method or a combination thereof.

31. A method according to claim 26, wherein the second conductive layer has a first width and the second conductive layer has a second width smaller than the first width.

32. A method according to claim 31, wherein a sectional shape of the portion of the gate electrode consisting of the first conductive layer is a tapered shape.

* * * * *